United States Patent
Usui et al.

(10) Patent No.: US 8,304,289 B2
(45) Date of Patent: Nov. 6, 2012

(54) SEMICONDUCTOR MODULE INCLUDING CIRCUIT COMPONENT AND DIELECTRIC FILM, MANUFACTURING METHOD THEREOF, AND APPLICATION THEREOF

(75) Inventors: Ryosuke Usui, Ichinomiya (JP); Yasunori Inoue, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 1 day.

(21) Appl. No.: 12/603,122

(22) Filed: Oct. 21, 2009

(65) Prior Publication Data
US 2010/0112760 A1    May 6, 2010

Related U.S. Application Data

(60) Division of application No. 11/371,044, filed on Mar. 9, 2006, now Pat. No. 7,622,805, which is a continuation of application No. PCT/JP2004/013038, filed on Sep. 8, 2004.

(30) Foreign Application Priority Data

| Sep. 9, 2003 | (JP) | 2003-316815 |
| Sep. 9, 2003 | (JP) | 2003-316837 |
| Sep. 17, 2003 | (JP) | 2003-324991 |
| Sep. 29, 2003 | (JP) | 2003-338628 |

(51) Int. Cl.
*H01L 21/98* (2006.01)

(52) U.S. Cl. .......... 438/118; 438/127; 257/E21.502; 257/E23.134

(58) Field of Classification Search ........ 438/118, 438/127; 257/E21.502, E23.134
See application file for complete search history.

(56) References Cited

U.S. PATENT DOCUMENTS

| 3,981,691 | A | 9/1976 | Cuneo |
| 5,497,033 | A | 3/1996 | Fillion et al. |
| 5,641,996 | A | 6/1997 | Omoya et al. |
| 5,834,850 | A | 11/1998 | Hotta et al. |
| 6,038,133 | A * | 3/2000 | Nakatani et al. ............ 361/760 |
| 6,340,641 | B1 | 1/2002 | Muraguchi et al. |
| 6,448,665 | B1 | 9/2002 | Nakazawa et al. |
| 6,600,234 | B2 | 7/2003 | Kuwabara et al. |
| 6,621,173 | B1 | 9/2003 | Yamakawa et al. |
| 6,762,508 | B1 | 7/2004 | Kiso et al. |
| 7,144,632 | B2 | 12/2006 | Hayes |
| 2002/0135058 | A1 | 9/2002 | Asahi et al. |
| 2003/0116836 | A1 | 6/2003 | Huang et al. |
| 2004/0082100 | A1 | 4/2004 | Tsukahara et al. |

FOREIGN PATENT DOCUMENTS

| JP | 7-509104 A | 10/1995 |
| JP | 8-293526 A | 11/1995 |
| JP | 8-162486 A | 6/1996 |

(Continued)

OTHER PUBLICATIONS

Taiwanese Office Action issued in Taiwan Patent Application No. 93127258, dated Mar. 21, 2007.

(Continued)

*Primary Examiner* — Wensing Kuo
(74) *Attorney, Agent, or Firm* — McDermott Will & Emery LLP

(57) ABSTRACT

Multiple semiconductor device components and passive device components fixed to a substrate are embedded within an electroconductive-film/insulating-resin-film structure, and are thermally bonded to an insulating resin film.

4 Claims, 27 Drawing Sheets

FOREIGN PATENT DOCUMENTS

| | | |
|---|---|---|
| JP | 11-24606 A | 1/1999 |
| JP | 2000-91425 A | 3/2000 |
| JP | 2000-138457 A | 5/2000 |
| JP | 2000-294601 | 10/2000 |
| JP | 2002-33437 A | 1/2002 |
| JP | 2002-076196 | 3/2002 |
| JP | 2002-100725 A | 4/2002 |
| JP | 2002-110717 A | 4/2002 |
| JP | 2002-357846 A | 12/2002 |
| JP | 2003-023124 | 1/2003 |
| JP | 2003-188198 A | 7/2003 |
| JP | 2003-347473 A | 12/2003 |
| KR | 10-2000-0029197 | 5/2000 |
| KR | 10-2000-0053561 | 8/2000 |
| KR | 10-2001-0015419 | 2/2001 |
| KR | 10-2001-0015895 | 2/2001 |
| KR | 2002-0016595 | 3/2002 |
| WO | WO 94/25987 | 11/1994 |
| WO | WO 98/21750 | 5/1998 |

OTHER PUBLICATIONS

Korean Office Action issued in Korean Patent Application No. 10-2006-7004737, dated Mar. 26, 2007.
Korean Office Action, with English translation, issued in Korean Patent Application No. KR 10-2006-7004737, mailed Jan. 21, 2008.
Korean Office Action issued in Korean Patent Application No. KR-10-2006-7004737 dated on Apr. 1, 2008.
Chinese Office Action issued in Patent Application No. 200480030531.X dated on Jun. 6, 2008.
Japanese Notification of Reason(s) for Refusal, w/ English translation thereof, issued in Japanese Patent Application No. JP 2005-513870 dated Apr. 20, 2010.
Japanese Office Action, with English translation, issued in Japanese Patent Application No. 2005-513870, mailed Oct. 19, 2010.

* cited by examiner

PRIOR ART

PRIOR ART

FRAME

COMPONENT MOUNTING

PACKAGING

ISB UNIT BLOCK

DIVISION (SCRIBE)

WASTE

[ISB] × 20 × 4 = 80
PRODUCT

PRIOR ART

SEMICONDUCTOR MODULE INCLUDING CIRCUIT COMPONENT AND DIELECTRIC FILM, MANUFACTURING METHOD THEREOF, AND APPLICATION THEREOF

RELATED APPLICATIONS

This application is a Divisional of U.S. patent application Ser. No. 11/371,044, filed on Mar. 9, 2006 now U.S. Pat. No. 7,622,805, which is a continuation of International Application PCT/JP2004/013038, filed Sep. 8, 2004, claiming priority of Japanese Patent Application Nos. JP 2003-316815, filed on Sep. 9, 2003, JP 2003-316837, filed on Sep. 9, 2003, JP 2003-324991, filed on Sep. 17, 2003, and JP 2003-338628, filed on Sep. 29, 2003, the entire contents of each of which are hereby incorporated by reference.

BACKGROUND OF THE INVENTION

1. Field of the Invention

The present invention relates to a semiconductor module and semiconductor device including circuit components, a manufacturing method therefor, and a display device including an optical device component.

2. Description of the Related Art

As the development of high-performance portable electronic devices such as cellular phones, PDAs, DVCs, DSCs, and so forth accelerates, reduction in the size and weight thereof is indispensable to satisfy the demands of the market. In order to realize such high-performance portable electronic devices, high-integrated system LSIs are required. On the other hand, there is a demand for such high-performance portable electronic devices which provide improved ease of use and higher-level conveniences. This requires higher-performance LSIs having higher-level functions employed in such portable electronic devices. This leads to a situation in which there is a strong demand for reduction in the size of the LSI package, while at the same time an LSI chip includes an increased number of I/O ports due to the increased circuit density of the LSI chip. In order to satisfy both demands, there is a strong demand for the development of a semiconductor package suitable for mounting semiconductor device components on a board with high circuit density. In order to meet these demands, various package techniques, namely the so-called CSP (Chip Size Package), have been developed.

As an example of such a package, BGA (Ball Grid Array) is known. The BGA has a structure as follows. That is to say, first, a semiconductor chip is mounted on a package substrate. Then, this assembly is molded in resin, following which solder balls serving as external terminals are two-dimensionally arrayed on the face of the assembly opposite to the molded side. With the BGA, mounting can be performed using the solder balls two-dimensionally arrayed on the face thereof. This enables the package size to be reduced in a relatively simple manner. Furthermore, there is no need to design a circuit board at a narrow pitch. Accordingly, such an arrangement does not require high-precision mounting techniques. Thus, an arrangement employing the BGA enables total mounting costs to be reduced even if the cost of the package is somewhat high.

FIG. 1 is a diagram which shows a schematic configuration of a typical BGA. A BGA 100 has a structure in which an LSI chip 102 is mounted on a glass epoxy substrate 106 via an adhesive layer 108. The LSI chip 102 is molded in a sealing resin 110. The LSI chip 102 and the glass epoxy substrate 106 are electrically connected via metal wires 104. Solder balls 112 are arrayed on the rear face of the glass epoxy substrate 106. The BGA 100 is mounted on a printed wiring board via the solder balls 112.

Examples of sealing methods for sealing a semiconductor chip in such a package includes: a transfer mold method; injection mold method, potting method, dipping method, and so forth (see Japanese Patent Laid Open Publication H8-162486, for example).

However, these conventional CSPs have difficulty in satisfying current requirements for sufficiently small-size, thin, and lightweight portable electronic devices. Furthermore, these conventional CSPs have certain limits with regard to the improvement of their heat dissipation performance.

Related Art List

JPA Laid open H8-162486
JPA Laid open 2002-110717
JPA Laid open 2000-91425
JPA Laid open H11-24606

SUMMARY OF THE INVENTION

The present invention has been made in view of the aforementioned problems. It is an general purpose of the present invention to provide a technique for enabling a small-size and thin electronic device including semiconductor modules to be manufactured.

The present inventor has diligently studied the aforementioned problems, and consequently has found solutions to the aforementioned problems, according to a first, second, and third groups of embodiments according to aspects of the present invention.

First, description will be made regarding a first group of embodiments according to several embodiments of the present invention.

A semiconductor module according to an embodiment of this group comprises an insulating resin film, and multiple circuit components embedded within the insulating resin film.

With such an arrangement, the multiple circuit components are fixed within the insulating resin film. Here, the multiple circuit components are preferably fixed by bonding, and more preferably fixed by thermal bonding. Examples of circuit components include semiconductor device components and passive device components.

Thermosetting resin is preferably employed as an insulating resin film. Also, the insulating resin film may be bonded to the circuit components with the insulating resin having been softened. This improves the adherence between the insulating resin film and each circuit component.

With such an arrangement, the multiple circuit components are adhered to the insulating resin film by bonding, thereby improving the adherence between the insulating resin film and each circuit component. This enables the circuit components to be bonded to the insulating resin film without using impurities such as an adhesive and so forth, thereby improving the electric properties of the semiconductor module. Furthermore, such an arrangement can be formed without extra adhesive later, thereby manufacturing a small-size, lightweight, and thin semiconductor module.

A semiconductor module according to an embodiment of this group comprises: an insulating resin film; multiple circuit components embedded within the insulating resin film; and an electroconductive film provided on the insulating resin film. With such an arrangement, the multiple circuit components are exposed on the face of the insulating resin film, opposite to the side on which the electroconductive film is provided.

With such an arrangement, the multiple circuit components are exposed, thereby improving the heat dissipation performance during the operation of the circuit components. Furthermore, such an arrangement enables the size of the semiconductor module to be reduced as compared with an arrangement in which the multiple circuit components are disposed on a substrate. Furthermore, such an arrangement provides the insulating resin film with a flat exposed surface. Such an arrangement which provides a flat exposed surface improves the adherence with an additional member in a step in which the additional member is adhered to the exposed surface, for example.

A semiconductor module according to an embodiment of this group comprises: an insulating resin film containing a filling material; multiple circuit components embedded within the insulating resin film; and an electroconductive film provided on the insulating resin film. With such an arrangement, the insulating resin film includes a first insulating resin film, and a second insulating resin film formed of a material containing the filling material with a higher concentration than that of the material forming the first insulating resin film. Furthermore, the second insulating resin film is provided so as to be in contact with the electroconductive film. On the other hand, the multiple of circuit components are embedded within the first insulating resin film.

Here, examples of filling materials include fillers and fibers. The filling material that can be employed in such an arrangement may be formed of a material which enables the insulating resin film to be formed with a thermal expansion coefficient close to that of the circuit components. Examples of the filling materials include $SiO_2$, $SiN$, $AlN$, $Al_2O_3$, and so forth, in the form of particles or fibers. Such an arrangement employing the insulating resin layer containing such a filling material has the advantage of suppressing undesired bending of the insulating resin film. The content of the filling material contained in the insulating resin film is determined as appropriate corresponding to the kind of the material. With the present embodiment, the content of the filling material contained in the insulating resin film is determined within the aforementioned range. This improves the adherence between the insulating resin film and each circuit component. Such an arrangement enables the circuit components to be properly adhered to the insulating resin film by bonding without using any adhesive material or the like. This enables the size of the semiconductor module to be reduced. Also, an aramid nonwoven fabric is preferably employed as the fiber. Such an arrangement employing such an material improves the fluidity of the insulating resin film.

Such an arrangement which employs the insulating resin film including the first insulating resin film and the second insulating resin film offers the following advantages in a step in which the multiple circuit components are bonded to and embedded within the insulating resin film. That is to say, the multiple circuit components can be easily embedded within the first insulating resin film due to the flexibility of the first insulating resin film, which contains a smaller amount of the filling material. At the same time, the deformation of the insulating resin film is suppressed due to a certain degree of rigidity of the second insulating resin film. With such an arrangement, the second insulating resin film prevents the multiple circuit components from penetrating too far toward the second insulating resin film to a certain degree. This provides the insulating resin film with a flat surface on which the electroconductive film is formed, even if the multiple circuit device components are of different heights. Furthermore, with such an arrangement, the first insulating resin film contains a low content of the filling material, thereby improving the adherence with each of the multiple circuit components. Furthermore, the second insulating resin film contains a high content of the filling material, thereby suppressing bending of the insulating resin film. Note that an arrangement may be made in which the first insulating resin film contains no filling material.

A manufacturing method for a semiconductor module according to an embodiment of this group comprises: a step for applying a layered structure of an insulating resin film and an electroconductive film onto fixed circuit components, such that the circuit components are embedded within the insulating resin film; and a step for fixing the circuit components within the insulating resin film by bonding. In such a method, these circuit components may be embedded within the insulating resin film with the multiple circuit components being fixed. Also, the circuit components provided on a substrate may be embedded within the insulating resin film in the step for embedding the circuit components within the insulating resin film. Also, such a manufacturing method may further include a step for removing the substrate from the circuit components after the step in which the circuit components are fixed within the insulating resin film, whereby the circuit components are exposed.

A semiconductor module according to an embodiment of this group comprises: a interconnection; an insulating resin film provided on the interconnection; a circuit component provided on the insulating resin film; and a fixing member provided on the insulating resin film, for fixing the circuit component. With such an arrangement, the circuit component is fixed to the insulating resin film. With such an arrangement, the circuit component is preferably fixed within the insulating resin film by bonding, and is more preferably fixed by thermal bonding. Examples of circuit components include semiconductor device components and passive device components.

A semiconductor module according to an embodiment of this group comprises multiple circuit components. With such an arrangement, the multiple circuit components are embedded within the fixing member such that the multiple circuit components and the fixing member together form an approximately flat surface.

The fixing member may be formed of an insulating resin material. The multiple circuit components may be bonded to the fixing member.

Such an arrangement provides the flat face of the insulating resin film onto which the multiple circuit components are adhered. This improves the adherence between the insulating resin film and the multiple circuit components.

A semiconductor module according to an embodiment of this group comprises a interconnection, an insulating layer provided on the interconnection, and circuit components provided on the insulating layer. A manufacturing method for the semiconductor module comprises: a step for fixing the circuit components on a fixing member; a step for forming the insulating layer by applying the insulating resin film on the circuit components, and bonding the insulating resin film to the circuit components; and a step for forming the interconnection on the insulating resin film.

With the manufacturing method for the semiconductor module according to an embodiment of this group, the insulating layer and the interconnection are formed after the step in which the circuit components are fixed. This improves the stability of the manufacturing process for the semiconductor module. Furthermore, the insulating resin film and the interconnection are formed on the circuit components by bonding, thereby simplifying the manufacturing process for the semiconductor module.

With the manufacturing method for the semiconductor module according to an embodiment of this group, the step for fixing the circuit components may include a step for fixing the multiple circuit components on the face of the fixing member such that one face of each of the multiple circuit components is positioned so as to be on an approximately flat plane. Furthermore, in the step for forming the insulating layer, the insulating layer may be formed by bonding the insulating resin film to the faces of the multiple circuit components.

Such an arrangement provides a flat plane on which the multiple circuit components are adhered to the insulating resin film. This improves the adherence between the multiple circuit components and the insulating resin film.

The step for fixing the multiple circuit components to the face of the fixing member may include a step for embedding the multiple circuit components within the fixing member such that the plurality of circuit components and the fixing member together form an approximately flat surface.

The step for fixing the multiple circuit components to the face of the fixing member may include: a step for embedding the multiple circuit components within a second insulating resin film in the state in which the multiple circuit components are fixed to a generally flat substrate, such that the multiple circuit components are fixed within the second insulating resin film; and a step for removing the substrate from the multiple circuit components so as to expose the multiple circuit components.

The step for fixing the multiple circuit components within the second insulating resin film may include a step for fixing the multiple circuit components within the second insulating resin film by bonding.

With the manufacturing method for the semiconductor module according to an embodiment of this group, the semiconductor module may further include a sealing layer formed so as to cover the circuit components. With such an arrangement, the step for fixing the circuit components may include a step for forming the sealing layer by sealing the circuit components with an insulating resin material such that a part of the circuit components remains exposed. Furthermore, in the step for forming the insulating layer, the insulating layer may be formed by applying the insulating resin film on the sealing layer, and bonding the insulating resin film to the exposed part of the circuit components.

With such an arrangement, the insulating layer and the interconnection are formed after a step in which the circuit components are sealed. Thus, the sealing layer serves as a supporting substrate in the step in which the interconnection layer is formed. This enables the step for removing the supporting substrate to be omitted, thereby simplifying the manufacturing process for the semiconductor module. Furthermore, such an arrangement provides a structure in which the circuit components are directly mounted on the interconnection layer formed of the insulating layer and the interconnection. This improves the heat dissipation performance of the semiconductor module.

In the step for forming the insulating layer, an insulating resin film having an electroconductive film formed on one face thereof is provided onto the circuit components, and wherein, in the step for forming the interconnect pattern, the interconnect pattern is formed by patterning of the electroconductive film.

Next, description will be made regarding a second group according to other embodiment of the present invention.

A semiconductor device according to an embodiment of this group comprises: a substrate on which circuit components are provided; a lower interconnection layer which is provided on the substrate, and which includes a lower-layer interconnection connected to the circuit components; and an upper interconnection layer including an insulating resin film fixed to the lower interconnection layer, and an upper interconnection provided to the insulating resin film. With such an arrangement, the fixing processing is performed by bonding, and is more preferably performed by thermal bonding. Examples of circuit components include semiconductor device components and passive device components.

With regard to the semiconductor device having a multi-layer interconnect structure, there is a demand for high-speed operation of the device, a demand for reduction in size thereof, and a demand for reduction in manufacturing costs. Such demands require fine manufacturing of the lower interconnection layer thereof. Accordingly, there is a need to form a interconnection using a damascene method since Cu is needed as a material of the interconnection. On the other hand, a global interconnection of the upper interconnection layer is preferably formed with the interconnection with a somewhat large width for ensuring a stable supply of power. Here, the upper interconnection may be formed with a width of 10 μm or more. In a case that there is no need to form a interconnection with a fine width, the interconnection which exhibits satisfactory performance may be formed by etching or the like. With an arrangement according to an embodiment of this group, the lower interconnection layer is formed with a semiconductor process such as the damascene method or the like. Subsequently, the insulating resin film and the electroconductive film are adhered on the lower interconnection layer by bonding. Then, the interconnection is formed in the upper interconnection layer by etching or the like. Such an arrangement simplifies the manufacturing process for the multi-layer interconnect structure, thereby greatly reducing the manufacturing time.

With the semiconductor device according to an embodiment of this group, aluminum (Al) may be employed as the material of interconnection of the lower interconnection layer, instead of formation of the lower interconnection layer using the damascene method. Even in this case, copper can be employed as the material of interconnection of the upper interconnection layer. This improves electromigration resistance with respect to the material of interconnection of the upper interconnection layer, thereby improving the stability of the semiconductor device.

The semiconductor device may comprise: a substrate including circuit components; a lower interconnection layer which is provided on the substrate, and which includes a lower interconnect pattern connected to the circuit components; and an upper interconnection layer which is formed on the lower interconnection layer, and which includes an insulating resin film containing a filling material and an upper interconnect pattern provided to the insulating resin film.

The insulating resin film of the upper interconnection layer may contain epoxy resin, BT resin, liquid crystal polymer, PPE resin, polyimide resin, fluorocarbon resin, phenol resin, or polyamide bismaleimide.

The lower interconnection layer contains an insulating film formed of a different material from the material forming the insulating resin film contained in the upper interconnection layer.

The upper interconnection pattern is formed of metal containing crystal particles having the major axis approximately perpendicular to the layered direction of the substrate.

A semiconductor device according to an embodiment of this group comprises: a substrate including circuit components; a lower interconnection layer which is provided on the substrate, and which includes a lower-layer interconnection connected to the circuit components; and an upper interconnection layer which includes an insulating resin film which is formed on the lower interconnection layer, and which contains epoxy resin, BT resin, liquid crystal polymer, PPE resin, polyimide resin, fluorocarbon resin, phenol resin, or polyamide bismaleimide, and an upper-layer interconnection which is provided on the insulating resin film.

Such an insulating resin film employing such a material ensures that the semiconductor device is rigid, thereby improving the stability of the semiconductor device. From this perspective, thermosetting resin is preferably employed as the insulating resin film. With the semiconductor device according to this group, the dielectric film of the lower interconnection layer may be formed of a material having a low dielectric constant, for example, which reduces the electric resistance of the interconnection. On the other hand, the dielectric film of the upper interconnection layer may be formed of such a material as described above, which increases the rigidity of the semiconductor device. As described above, such an arrangement enables the lower interconnection layer and the upper interconnection layer to each be formed of materials having suitable properties as appropriate. This suppresses the problem of the wiring delay occurring in the semiconductor device while improving the stability of the semiconductor device.

A semiconductor device may comprise: a substrate including circuit components; a lower interconnection layer which is provided on the substrate, and which includes a lower interconnect pattern connected to the circuit components; and an upper interconnection layer which is formed on the lower interconnection layer, and which includes a interconnect pattern formed of metal which contains crystal particles having the major axis approximately perpendicular to the layered direction of the substrate.

A manufacturing method according to this group, for manufacturing a semiconductor device having a multi-layer interconnect structure formed on a substrate on which circuit components are provided, the manufacturing method comprises: a step for forming a lower interconnection layer on the substrate, which includes a lower-layer interconnection connected to the circuit components; and a step for forming an upper interconnection layer by applying a layered structure formed of an insulating resin film and an electroconductive film onto the lower interconnection layer, and by bonding the insulating resin film to the lower interconnection layer.

With regard to the upper interconnection layer, the interconnect structure may be formed by forming the interconnection after bonding of the layered structure onto the lower interconnection layer. Also, the upper interconnection layer may be provided and bonded onto the lower interconnection layer after formation of the interconnect structure of the upper interconnection layer. The method in which the upper interconnection layer is provided onto the lower interconnection layer after formation of the interconnect structure of the upper interconnection layer has the advantage as follows. That is to say, such a method allows the range of chemicals and so forth that can be used for manufacturing the interconnect structure of the upper interconnection layer to be expanded without the need to give consideration to any adverse effect on the device properties of the circuit components. In a case of employing such a manufacturing method in which the interconnect structure of the upper interconnection layer is formed beforehand, the interconnect structure is preferably formed giving consideration to the thermal contraction thereof which occurs in a step in which the upper interconnection layer is thermally bonded to the lower interconnection layer.

The step for forming the lower interconnection layer may comprise: a step for forming an dielectric film on the substrate; a step for forming recesses in the dielectric film by selectively removing the dielectric film; a step for forming a metal film on the dielectric film so as to fill the void left within each of the recesses; and a step for removing the metal film formed outside of the recesses.

Next, description will be made regarding a third group according to yet other embodiment of the present invention.

A display device according to this group comprises: a substrate including a display region and a driving circuit region where circuit components are disposed; an insulating resin film which is provided in the driving circuit region of the substrate so as to cover the circuit components, and which is fixed to the circuit components and the substrate; and an electroconductive film provided on the insulating resin film. With such an arrangement, the driving circuit region may be provided in the periphery of the display region. With such an arrangement, the fixing processing is performed by bonding, and is more preferably performed by thermal bonding.

With such an arrangement, the insulating resin film is adhered to the circuit components and the substrate by bonding, thereby improving the adherence between the insulating resin film and each of the circuit components and substrate. This enables the driving circuit to be formed without using any flexible substrate or the like, thereby simplifying the configuration of the display device. Furthermore, such an arrangement provides a small-size and lightweight display device.

Note that the display device may include electro-optic device components. Such a display device displays an image on the display region by actions of the electro-optic device components. The electro-optic device components may be formed on a single substrate along with the driving circuit. Also, the electro-optic device components may be formed on another substrate separate from the substrate on which the deriving circuit is formed. That is to say, the term "substrate" as used in the present specification encompasses a set of multiple substrates on which the display region and the driving circuit region are separately formed, as well as a single substrate on which both the display region and the driving circuit region are formed.

The electroconductive film may be formed of metal which contains crystal particles having the major axis along the direction of the plane the substrate.

While description has been made regarding arrangements according to the present invention, any combination of these arrangements are also a valid arrangement of the present invention. Also, an arrangement made in a different category according to terms of the present invention is also a valid arrangement of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Description will be made below regarding a first, second, and third groups of embodiments according to the present invention in that order.

(First Group)

Prior to description of the embodiments, description will be made regarding an ISB structure which can employ these embodiments.

The ISB (Integrated System in Board; registered trademark) is a unique package developed by the present applicant. The ISB is a unique package system for packaging electronic circuits where semiconductor bare chips are the primary components, using copper interconnections without involving any core (substrate) for supporting the circuit components. That is to say, the ISB is a unique coreless system-in-package.

Figure 1:
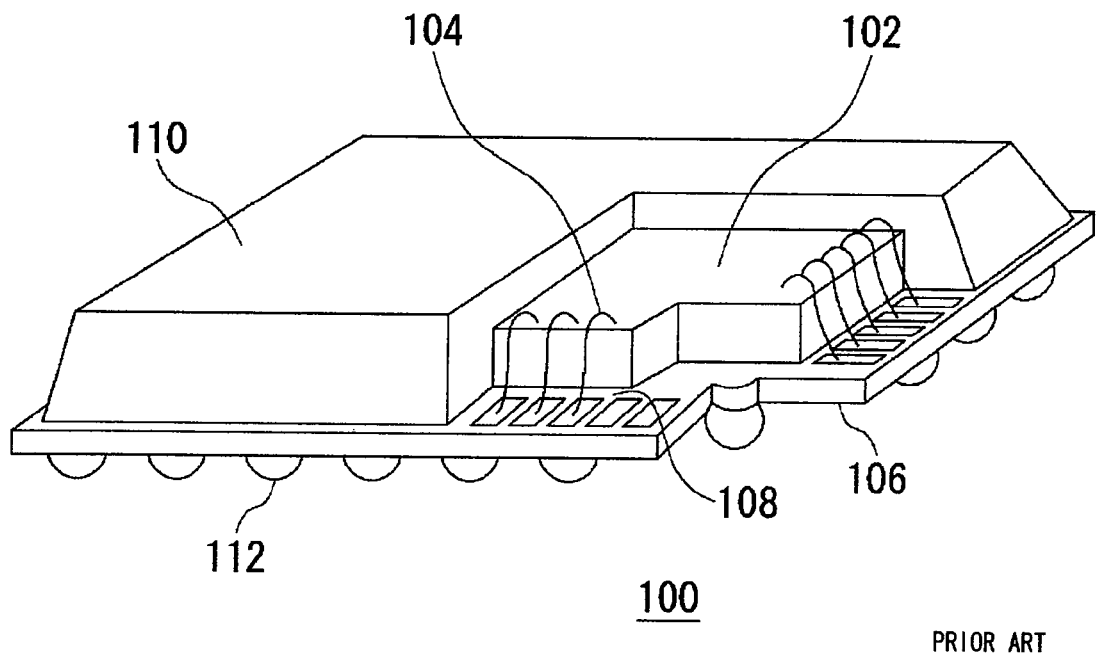
FIG. 1 is a diagram which shows a schematic configuration of a typical BGA.
Figure 2:
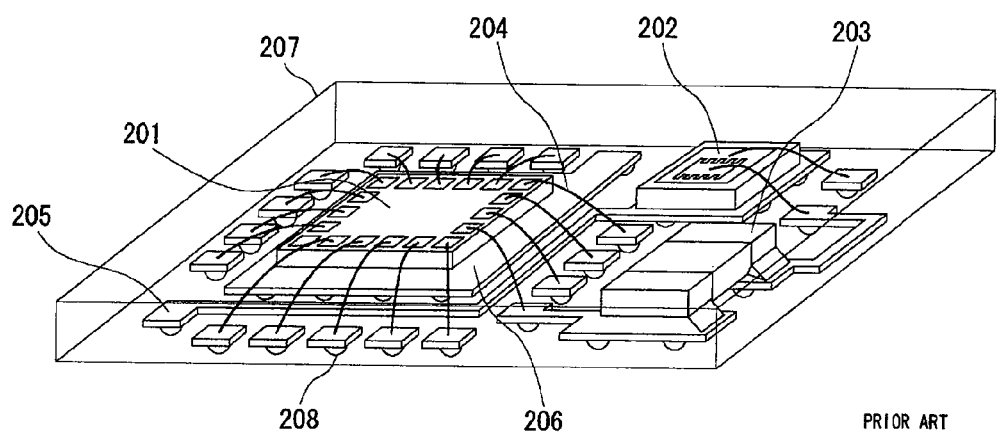
FIG. 2 is a diagram for describing the structure of an ISB (registered trademark)

FIG. 2 is a schematic structure diagram which shows an example of the ISB. While FIG. 2 shows an arrangement having a single interconnection layer for convenience of description of the overall structure of the ISB, in general, the ISB has a multi-layer structure in which multiple interconnection layers are layered. The ISB shown in FIG. 2 has a structure in which an LSI bare chip 201, a transistor bare chip 202, and a chip CR 203 are connected via copper patterns 205. The LSI bare chip 201 is electrically connected to lead electrodes and interconnections, each of which includes a solder ball 208 on the rear face thereof, through bonded gold wires 204. Furthermore, electroconductive paste 206 is provided just underneath the LSI bare chip 201. The ISB is mounted on a printed wiring board through the electroconductive paste 206. Note that the ISB has an overall structure in which the device components are molded in a resin package 207 formed of epoxy resin or the like.

The aforementioned packaging technique provides following advantages.

(i) This packaging technique offers coreless mounting. This enables transistors, ICs, and LSIs to be manufactured with reduced size and thickness.

(ii) This packaging technique offers a circuit made up of transistors, system LSIs, chip type capacitors, resistors, and so forth, and offers a packaging technique therefor. This makes it possible to manufacture a high-performance SIP (System in Package).

(iii) This packaging technique enables currently-available semiconductor device components to be combined. This allows a system LSI to be developed in a short period of time.

(iv) With this packaging technique, semiconductor bare chips are directly mounted on a copper base, thereby providing high efficiency heat dissipation.

(v) With this packaging technique, the circuit interconnection is formed of copper, and a core member is not required. This provides the circuit wring pattern with a low dielectric constant. Such an arrangement offers excellent properties in high-speed data transmission and excellent properties of a high-frequency circuit.

(vi) This packaging technique employs a structure in which electrodes are embedded within the package. This suppresses particle contamination of the electrode members.

(vii) With this packaging technique, the package size can be designed as desired. The amount of waste material which results from the manufacture of such a package is approximately 1/10 of that of a SQFP package with 64 pins for each package. This reduces the environmental impact.

(viii) This packaging technique provides a circuit board having functions, as distinct from conventional printed circuit boards for mounting device components, which offers the potential for new concept system configuration.

(ix) The pattern of the ISB can be easily designed in the same way as with the pattern of a printed circuit board. Thus, the pattern of the ISB can be designed by the manufacture's engineers themselves.

Figure 3A:
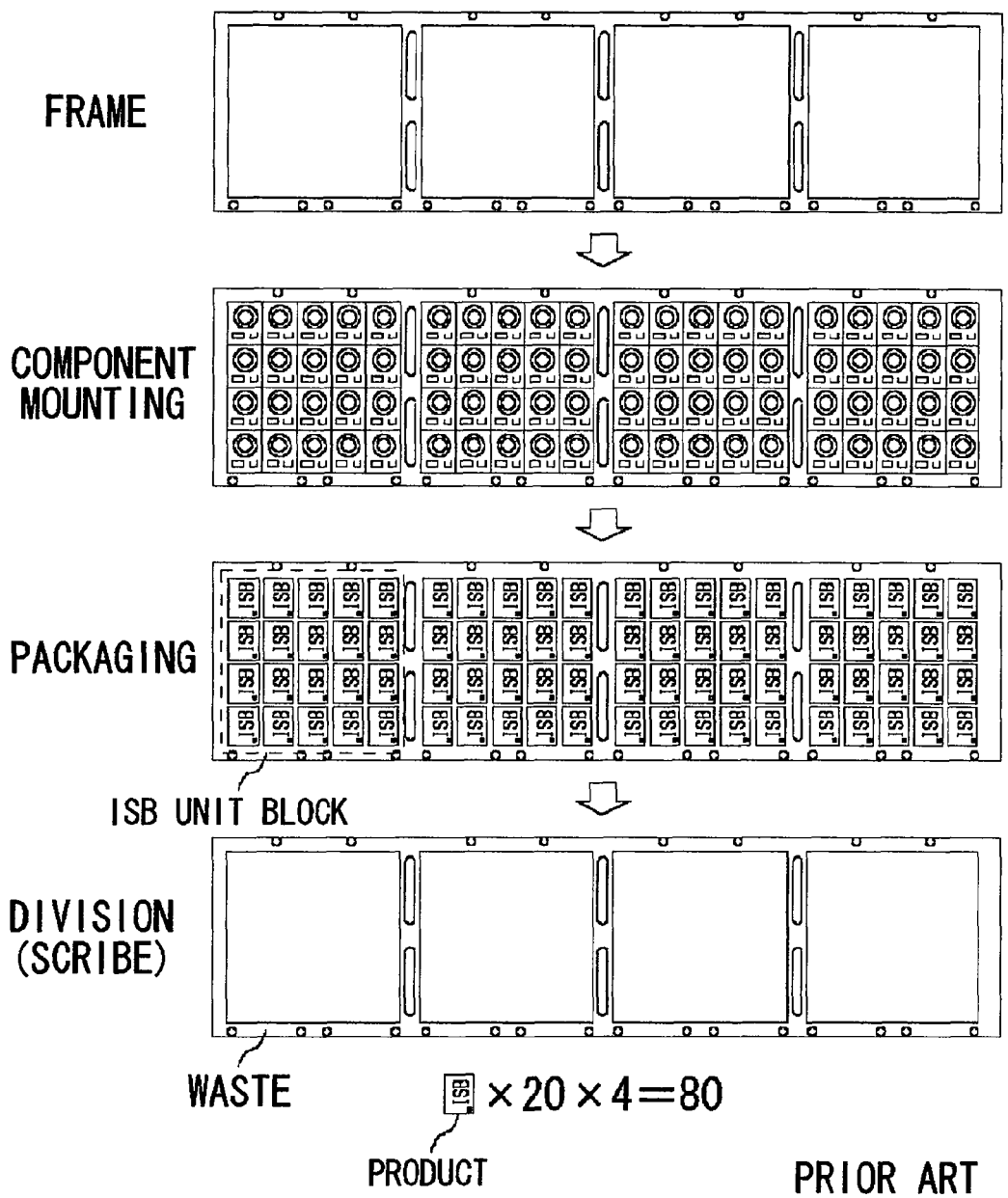
FIG. 3A is a diagram for describing a manufacturing process for the ISB.
Figure 3B:
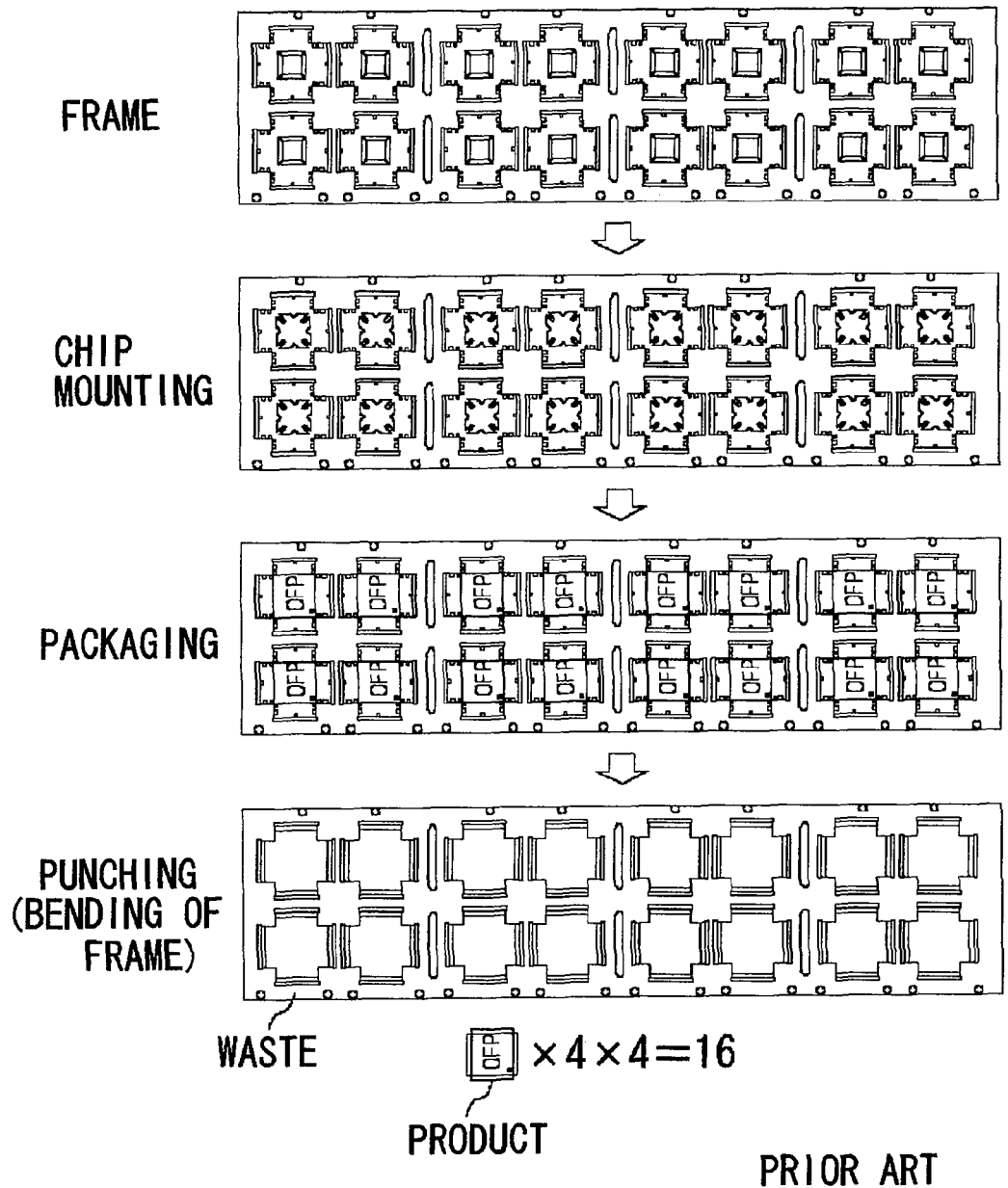
FIG. 3B is a diagram for describing a manufacturing process for a conventional CSP.

Next, description will be made regarding advantages of a manufacturing process for the ISB. FIGS. 3A and 3B are diagrams for describing a manufacturing process for a conventional CSP and a manufacturing process for an ISB related to the present embodiment for the purpose of comparative explanation. FIG. 3B shows a manufacturing process for the conventional CSP. First, frames are formed on a base substrate. Then, chips are mounted on each device formation region divided by these frames. Subsequently, thermosetting resin is applied to each device, thereby forming a package for each device. Subsequently, punching is performed for each device using a die. In the punching, which is the final step, the molded resin and the substrate are cut at the same time. This leads to a problem of rough edges of the cut face. Furthermore, a great amount of waste is produced after such a punching process, leading to a problem from the perspective of the environmental impact.

On the other hand, FIG. 3A shows a manufacturing process for the ISB. With this manufacturing process, first, frames are provided onto a metal foil, and interconnections are formed for each module formation region. Then, circuit devices such as LSIs are mounted on each module formation region. Subsequently, each module is packaged. Finally, dicing is performed along the scribe regions thereof, thereby obtaining the finished products. After the packaging, the metal foil, which is used as a substrate, is removed before the scribing process. This means that dicing is only performed on the resin layer in this scribing process. Such a process suppresses the roughness of the cut face thereof, and improves the precision of the dicing.

(First Embodiment)

FIGS. 4A through 4F are cross-sectional diagrams which show a manufacturing process for semiconductor modules according to a first embodiment of the first group of the present invention.

Figure 4A:
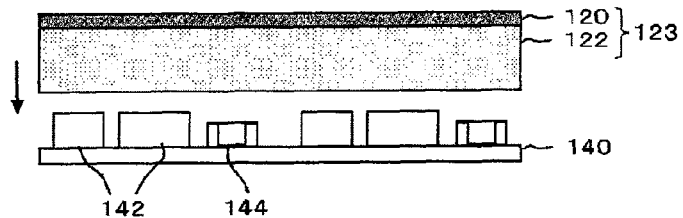
FIGS. 4A through 4F are cross-sectional diagrams which show a manufacturing process for a semiconductor module according to a first embodiment of a first group of the present invention.

First, as shown in FIG. 4A, circuit components such as multiple semiconductor device components 142, passive device components 144, and so forth, are fixed on a substrate 140. Here, the substrate 140 may be a base of adhesive tape which enables the semiconductor device components 142 and the passive device components 144 to be fixed on the face thereof. Furthermore, the substrate 140 may be formed of a material of a nature that enables the substrate 140 to be removed from an insulating resin film 122 after a step in which the semiconductor device components 142 and the passive device components 144 are embedded in the insulating resin film 122. Examples of such a material which can be employed include a PET film, for example.

Examples of the semiconductor device components 142 include transistors, diodes, IC chips, and so forth, for example. On the other hand, examples of the passive device components 144 include chip capacitors, chip resistors, and so forth, for example.

Figure 4B:
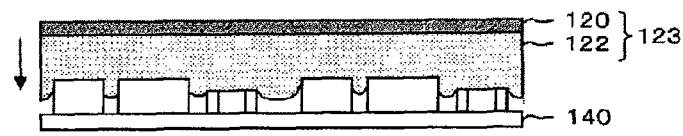
Figure 4C:
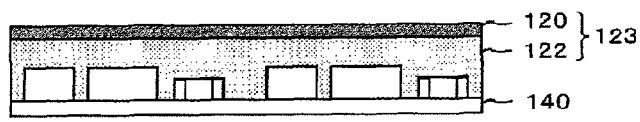

As shown in FIG. 4B, an electroconductive-layer/insulating-resin-layer structure 123 formed of an electroconductive film 120 and the insulating resin film 122 is applied to the substrate 140 on which the multiple semiconductor device components 142 and the multiple passive device components 144 have been thus fixed. Specifically, the electroconductive-layer/insulating-resin-layer structure 123 is pressed in contact with the substrate 140 such that the semiconductor device components 142 and the passive device components 144 are embedded within the insulating resin film 122. Subsequently, the insulating resin film 122 is heated in a vacuum or at a reduced pressure, whereby the insulating resin film 122 is bonded to the substrate 140. Thus, the semiconductor device components 142 and the passive device components 144 are embedded in and bonded to the insulating resin film 122 as shown in FIG. 4C.

The electroconductive film 120 may be formed of metal containing crystal particles having the major axis approximately perpendicular to the layered direction of the substrate. For example, rolled metal may be employed as such metal containing crystal particles having the major axis approximately perpendicular to the layered direction of the substrate. Examples of the rolled metal include copper foil, for example. Such an arrangement thus employing such rolled metal as the electroconductive film 120 prevents contamination by impurities such as gas and so forth, which Occurs in the process of forming interconnect members according to a sputter method, CVD method, plating method, or the like. This makes it possible to manufacture such interconnect members without annealing processing for removing such impurities. Such a manufacturing process without heating for annealing processing enables interconnection layers to be formed without damaging the performances of the semiconductor device components 142 and the passive device components 144. This improves the stability of each semiconductor module. Also, a pressed metal film formed according to an electroplating method may be employed as the aforementioned metal containing crystal particles having the major axis approximately perpendicular to the layered direction of the substrate. The insulating resin film 122 may be formed of any material having a nature which permits the material to be softened by heating. Specifically, examples of such materials include: epoxy resin; melamine derivatives such as BT resin; liquid crystal polymer; PPE resin; polyimide resin; fluorocarbon resin; phenol resin; polyamide bismaleimide; and so forth. An arrangement employing such materials provides a semiconductor device which exhibits excellent high-frequency properties and excellent product reliability. Also, an arrangement employing such materials improves the rigidity of each semiconductor module, thereby improving the stability of each semiconductor module. In particular, an arrangement in which the insulating resin film 122 is formed of thermosetting resin such as epoxy resin, BT resin, PPE resin, polyimide resin, fluorocarbon resin, phenol resin, polyamide bismaleimide, and so forth, further improves the rigidity of each semiconductor module.

Examples of the epoxy resin include: bisphenol A type resin; bisphenol F type resin; bisphenol S type resin; phenol novolac resin; cresol novolac type epoxy resin; trisphenol-methane-type epoxy resins; alicyclic epoxy resin; and so forth. Examples of the melamine derivative include:
melamine; melamine cyanurate; methylol-melamine; (iso) cyanuric acid; melam; melem; melon; succino-guanamine; melamine sulfate; aceto-guanamine sulfate; melam sulfate; guanyl-melamine sulfate; melamine resin; BT resin; cyanuric acid; iso-cyanuric acid; iso-cyanuric acid derivative; melamine iso-cyanurate; benzo-guanamine; melamine derivatives such as aceto-guanamine and so forth; guanidino compounds; and so forth.

Examples of the liquid crystal polymer include: aromatic liquid crystal polyester; polyimide; polyesterimide; and compositions containing such materials. Of these materials, liquid crystal polyester or a composition containing liquid crystal polyester is preferably employed since such a material exhibits well-balanced properties such as heat resistance, workability, and hygroscopicity.

Examples of the liquid crystal polyester includes: 1) a material obtained by a reaction between aromatic dicarboxylic acid, aromatic diol, and aromatic hydroxy carboxylic acid; (2) a material obtained by a reaction between different kinds of aromatic hydroxy carboxylic acid; (3) a material obtained by a reaction between aromatic dicarboxylic acid and aromatic diol; (4) a material obtained by a reaction between polyester such as polyethylene terephthalate and aromatic hydroxy carboxylic acid; and so forth. Note that, the ester derivative thereof may be employed, instead of the aforementioned aromatic dicarboxylic acid, aromatic diol, and aromatic hydroxy carboxylic acid. Also, materials in which the aromatic part of the aforementioned aromatic dicarboxylic acid, aromatic diol, and aromatic hydroxy carboxylic acid, are replaced by a halogen atom, alkyl group, or aryl group, may be employed.

Examples of the repeating structure units of the aforementioned crystal polyester include: a repeating structure unit derived from aromatic dicarboxylic acid (the following Expression (i)); a repeating structure unit derived from aromatic diol (the following Expression (ii)); and a repeating structure unit derived from aromatic hydroxy carboxylic acid (the following Expression (iii)).

—CO-A1-CO—  (i)

(here, A1 represents a ligand with a valence of 2 containing an aromatic ring)

—O-A2-O—  (ii)

(here, A2 represents a ligand with a valence of 2 containing an aromatic ring)

—CO-A3-O—  (iii)

(here, A3 represents a ligand with a valence of 2 containing an aromatic ring)

On the other hand, the insulating resin film 122 may contain a filling material such as filler, fiber, or the like. Examples of the filler include $SiO_2$, $SiN$, $AlN$, $Al_2O_3$, and so forth, in the form of particles or fibers. An arrangement employing the insulating resin film 122 containing such filler or fibers has the advantage of suppressing undesired bending of the insulating resin film 122 in the step when the insulating resin film 122 is cooled to room temperature, after the semiconductor device components 142 and the passive device components 144 have been thermally bonded to the insulting resin film 122 while heating the insulting resin film 122. This improves adherence between the insulating resin film 122 and each of the semiconductor device components 142 and the passive device components 144. Furthermore, the insulating resin film 122 containing such fibers exhibits improved fluidity. This improves the adherence between the insulating resin film 122 and each of the semiconductor device components 142 and the passive device components 144. Accordingly, from this perspective, an aramid non-woven fabric is preferably employed as a material contained in the insulating resin film 122. This improves the workability thereof.

Para-aramid fiber or meta-aramid fiber may be employed as the aramid fiber. Examples of the para-aramid fiber include poly(p-phenylene-terephthalamide) (PPD-T), for example. Examples of the meta-aramid fiber include poly(m-phenylene isophthalamide) (MPD-I), for example.

The content of the filler contained in the material forming the insulating resin film 122 may be determined as appropriate corresponding to the material. For example, the insulating resin film 122 may contain such filler at a concentration of 50% by weight or less. Such an arrangement suitably maintains the adherence between the insulating resin film 122 and each of the semiconductor device components 142 and the passive device components 144. Thus, the insulating resin film 122 is properly adhered to the semiconductor device components 142 and the passive device components 144 without using any adhesive or the like. This enables the size of each semiconductor module to be reduced.

The electroconductive-layer/insulating-resin-layer structure 123 may be formed by adhering the electroconductive film 120 onto the insulating resin film 122. Also, the electroconductive-layer/insulating-resin-layer structure 123 may be formed by coating a resin composition, which is a raw material of the insulating resin film 122, to the electroconductive film 120 and drying the resin composition thus coated. With the present embodiment, the resin composition may contain a hardening agent, hardening accelerator, and other components, without departing from the scope of the objects of the present embodiment. The electroconductive-layer/insulating-resin-layer structure 123 is applied onto the substrate 140 with insulating resin film 122 being in the B-staged state. Such an arrangement improves the adherence between the insulating resin film 122 and each of the semiconductor device components 142 and the passive device components 144. Subsequently, the insulating resin film 122 is heated corresponding to the kind of resin forming the insulating resin film 122. In this step, the electroconductive-layer/insulating-resin-layer structure 123 is bonded to the semiconductor device components 142 and the passive device components 144 in a vacuum or at reduced pressure. Also, another manufacturing method may be employed as follows. That is to say, first, the insulating resin film 122 in the B-stage state is applied onto the substrate 140. Then, the electroconductive film 120 is further applied onto the insulating resin film 122. Subsequently, the insulating resin film 122 is thermally bonded to the semiconductor device components 142 and the passive device components 144 while thermally bonding the electroconductive film 120 to the insulating resin film 122. Thus, the electroconductive-layer/insulating-resin-layer structure 123 is formed. Such an arrangement suitably maintains the adherence between the insulating resin film 122 and each of the semiconductor device components 142 and the passive device components 144, without damaging the circuit components.

Figure 4D:
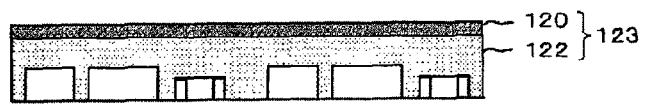

As described above, the electroconductive-layer/insulating-resin-layer structure 123 is thermally bonded to the semiconductor device components 142 and the passive device components 144 with the semiconductor device components 142 and the passive device components 144 being embedded within the insulating resin film 122. Subsequently, as shown in FIG. 4D, the substrate 140 is removed from the insulating resin film 122. Alternatively, the intermediate products with the substrate remaining thereon may be transferred to the next mounting step after the aforementioned step in which semiconductor device components 142 and the passive device components 144 are bonded onto the insulating resin film 122. Then, the substrate may be removed in the mounting step. Such an arrangement protects the circuit components in transferring thereof.

Figure 4E:
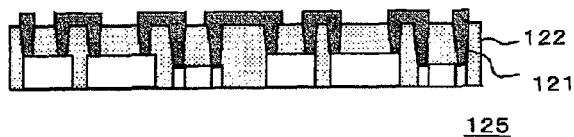
Figure 4F:
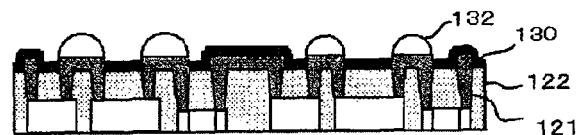

Furthermore, following this step, through holes are formed in the resin film, and each through hole is filled with an electroconductive material, thereby forming via plugs 121. Subsequently, patterning of the electroconductive film 120 is performed such that the multiple semiconductor device components 142 and passive device components 144 are electrically connected. Thus, a sealed structure 125 is obtained having a structure in which the semiconductor device components 142 and the passive device components 144 are sealed within the insulating resin film 122 on one side thereof while these device components are exposed on the face of the opposite side thereof, as shown in FIG. 4E. Subsequently, an dielectric film 130 serving as a protective layer and solder balls 132 are formed on the upper face of the sealed structure 125 as shown in FIG. 4F.

Such an arrangement in which the semiconductor device components 142 and the passive device components 144 are exposed on the face opposite to the sealed face has the advantage as follows. That is to say, in a case that the temperature of the semiconductor device components 142 and the passive device components 144 increases due to the operation thereof, the heat can be released from the exposed face. This provides the semiconductor module with excellent heat dissipation performance. Furthermore, various cooling methods may be applied to such an arrangement. For example, a heat sink may be provided to the exposed faces of the semiconductor device components 142 and the passive device components 144. Also, the exposed faces may be cooled by air.

Furthermore, such an arrangement has no substrate or the like on the face opposite to the sealed side, where the semiconductor device components 142 and the passive device components 144 are sealed. This enables the size of each semiconductor module to be reduced. Furthermore, such an arrangement provides the exposed face of the insulating resin film with reduced roughness. Such reduced roughness of the insulating resin film improves the adherence between the insulating resin film and additional components in the following step in which the additional components are adhered onto the exposed face.

As described later, with the semiconductor module thus manufactured, another electroconductive-layer/insulating-resin-layer structure 123 may be layered on the electroconductive film 120 of the electroconductive-layer/insulating-resin-layer structure 123 so as to form a interconnection layer. This enables the multiple semiconductor device components 142 and the passive device components 144 to be electrically connected. Also, this enables the semiconductor module to be electrically connected to another device.

With the manufacturing process for the semiconductor module according to the present embodiment, the multiple semiconductor device components 142 and the passive device components 144 can be embedded and sealed within the insulating resin film 122 in a simple manner. Furthermore, this improves the heat dissipation performance of the semiconductor module. Furthermore, this enables the size of the semiconductor module to be reduced.

(Second Embodiment)

FIGS. 5A through 5D are cross-sectional diagrams which show a manufacturing process for a semiconductor module according to a second embodiment of the first group of the present invention. In the present embodiment, the same components as those in the first embodiment are denoted by the same reference numerals, and description thereof will be omitted as appropriate. The difference between the present embodiment and the first embodiment is that a flexible material, which can be extended, is employed as the substrate 140. A PET film may be employed as the substrate 140 according to the present embodiment, for example.

Figure 5A:
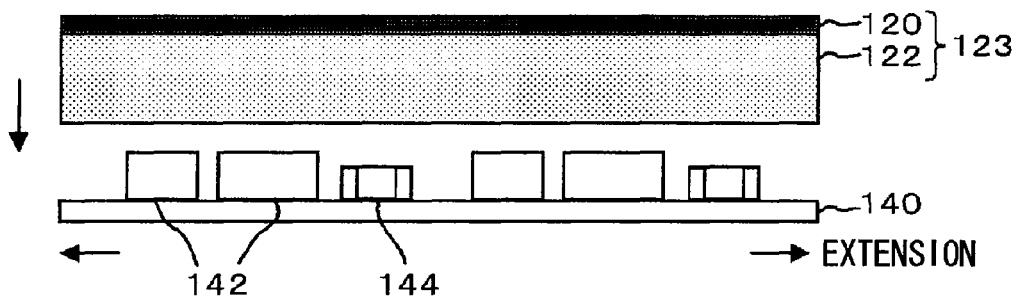
FIGS. 5A through 5D are cross-sectional diagrams which show a manufacturing process for a semiconductor module according to a second embodiment of the first group of the present invention.
Figure 5B:
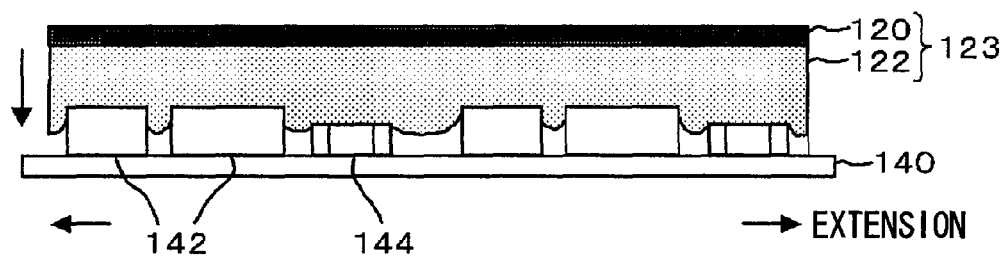
Figure 5C:
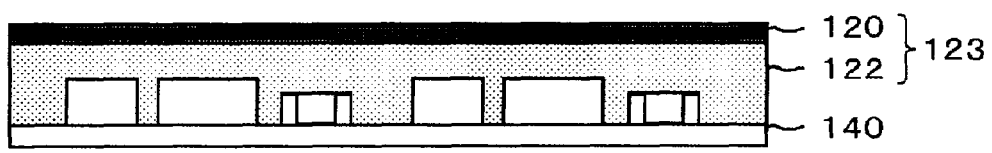

As shown in FIG. 5A, after the multiple semiconductor device components 142 and the passive device components 144 have been fixed on the substrate 140, the substrate 140 is extended in the horizontal direction in the drawing. Subsequently, as shown in FIG. 5B, the electroconductive-layer/insulating-resin-layer structure 123 is applied onto and is pressed in contact with the substrate 140 with the substrate 140 being extended, such that the semiconductor device components 142 and the passive device components 144 are embedded within the insulating resin film 122. After the semiconductor device components 142 and the passive device components 144 have been embedded within the insulating resin film 122, the force applied for extending the substrate 140 is released. Then, the insulating resin film 122 is thermally bonded onto the substrate 140 by heating in a vacuum or at a reduced pressure. As a result, as shown in FIG. 5C, the semiconductor device components 142 and the passive device components 144 are bonded onto and embedded in the insulating resin film 122. With the present embodiment, the semiconductor device components 142 and the passive device components 144 are pressed into contact with the insulating resin film 122 such that these device components are embedded within the insulating resin film 122 while the extended state of the substrate 140, on which these device components are fixed, is maintained. Such an arrangement provides increased space between the adjacent device components at the time when the semiconductor device components 142 and the passive device components 14 are pressed into contact with and are embedded within the insulating resin film 122. This facilitates the processing in which the insulating resin film 122 is applied to each space between the adjacent device components. Thus, such an arrangement improves the adherence between the insulating resin film 122 and each of the semiconductor device components 142 and the passive device components 144.

Figure 5D:

Subsequently, the substrate 140 is removed from the insulating resin film 122 as shown in FIG. 5D. Subsequently, via plugs are formed, and patterning of the electroconductive film 120 is performed, thereby improving the heat dissipation performance of the semiconductor module in the same way as with the first embodiment. Furthermore, such an arrangement enables the size of the semiconductor module to be reduced.

(Third Embodiment)

FIGS. 6A through 6D are cross-sectional diagrams which show a manufacturing process for a semiconductor module according to a third embodiment of the first group of the present invention. In the present embodiment, the same components as those in the first and second embodiments are denoted by the same reference numerals, and description thereof will be omitted as appropriate. The difference between the present embodiment and the first and second embodiments is that the semiconductor device components 142 and the passive device components 144 are thermally bonded onto the insulating resin film 122 such that these device components are embedded within the insulating resin film 122 with the substrate 140, on which the semiconductor device components 142 and the passive device components 144 have been fixed, being mounted on a supporting base 146.

Figure 6A:
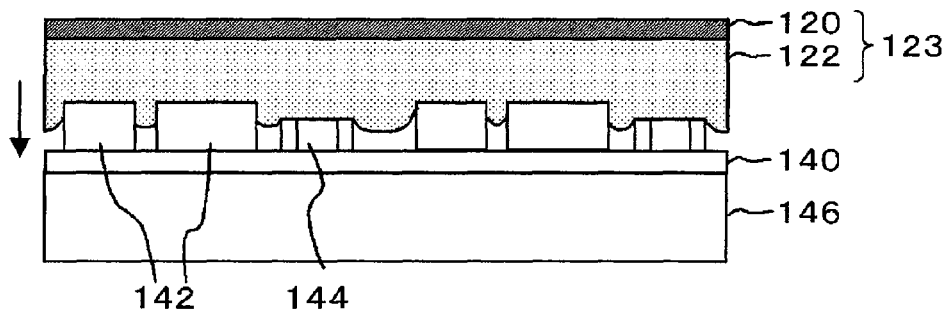
FIGS. 6A through 6D are cross-sectional diagrams which show a manufacturing process for a semiconductor module according to a third embodiment of the first group of the present invention.

With the present embodiment, as shown in FIG. 6A, after the multiple semiconductor device components 142 and the passive device components 144 have been fixed on the substrate 140, the substrate 140 is mounted on the supporting base 146. While the supporting base 146 is not restricted in particular, the supporting base 146 may be formed of a material having a greater rigidity than that of the material forming the substrate 140. Such an arrangement enables the face of the side opposite to the sealed side where the semiconductor device components 142 and the passive device components 144 are sealed with the insulating resin film 122, to be formed flat even in a case of employing the base 140 formed of a flexible material.

Subsequently, the electroconductive-layer/insulating-resin-layer structure 123 is applied to and pressed into contact with the substrate 140 such that the semiconductor device components 142 and the passive device components 144 are embedded within the insulating resin film 122. In this step, the semiconductor device components 142 and the passive device components 144 may be pressed into contact with and embedded within the insulating resin film 122 while the substrate 140 is being extended in the horizontal direction in the drawing as described in the second embodiment.

Figure 6B:
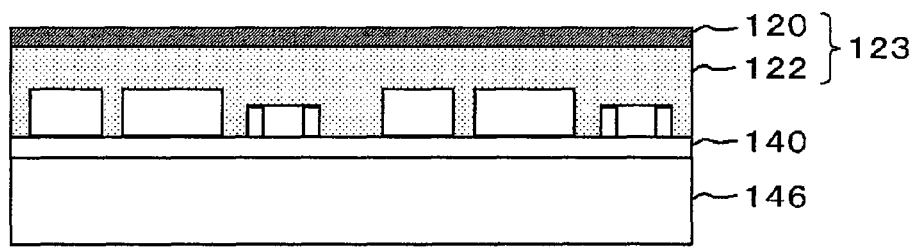
Figure 6C:
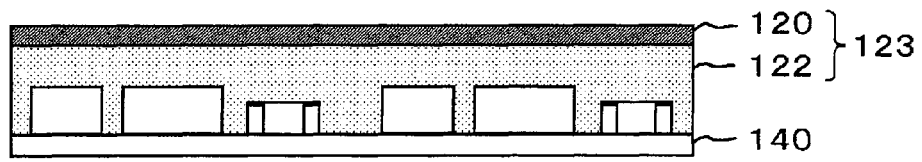
Figure 6D:
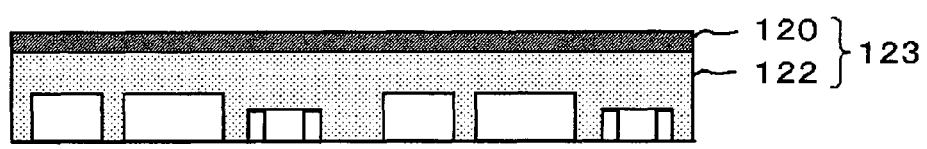

Subsequently, the insulating resin film 122 is heated in a vacuum or at a reduced pressure such that it adheres to the substrate 140. As a result, the semiconductor device components 142 and the passive device components 144 are embedded within the insulating resin film 122 as shown in FIG. 6B, whereby the semiconductor device components 142 and the passive device components 144 are fixed within the insulating resin film 122. Subsequently, the substrate 140 is removed from the supporting base 146 as shown in FIG. 6C. Also, with the present embodiment, the substrate 140 can be removed from the insulating resin film 122, as shown in FIG. 6D.

With the present embodiment, the semiconductor device components 142 and the passive device components 144 are pressed into contact with, embedded within, and thermally bonded to the insulating resin film 122 with the substrate 140 being mounted on the supporting base 146 having a greater rigidity than that of the substrate 140. This enables the face of the insulating resin film 122 that comes in contact with the substrate 140 to be formed flat. This enables the face where the semiconductor device components 142 and the passive device components 144 are exposed (which will be referred to as "exposed face" hereafter) to be formed flat after removal of the substrate 140 from the insulating resin film 122. Thus, in a case that an additional component is adhered to the exposed face of the insulating resin film 122 in which the semiconductor device components 142 and the passive device components 144 are embedded, such an arrangement exhibits improved adherence between the exposed face of the insulating resin film 122 and the additional component. Also, in a case of mounting the insulating resin film 122, in which the semiconductor device components 142 and the passive device components 144 are embedded, on an additional component such as a heat sink, the insulating resin film 122 can be mounted approximately horizontally while suppressing tilting thereof.

(Fourth Embodiment)

Figure 7:
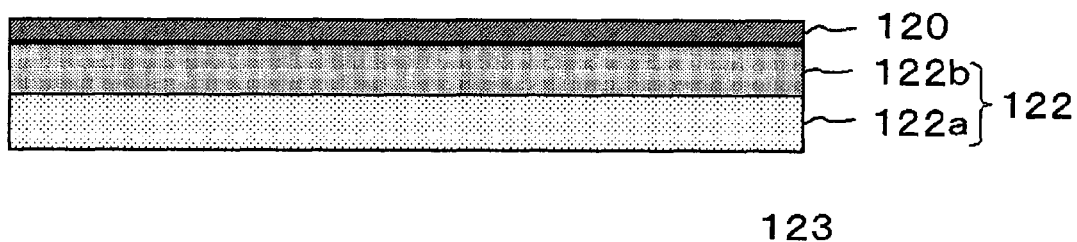
FIG. 7 is a cross-sectional diagram which shows a structure of an electroconductive-layer/insulating-resin-layer structure according to a fourth embodiment of the first group of the present invention.

FIG. 7 is a cross-sectional diagram which shows the structure of the electroconductive-layer/insulating-resin-layer structure 123 according to a fourth embodiment of the first group of the present invention. FIGS. 8A through 8D are cross-sectional diagrams which show a manufacturing process for a semiconductor module according to the present embodiment. The difference between the present embodiment and the first through third embodiments is that the insulating resin film 122 of the electroconductive-layer/insulating-resin-layer structure 123 is formed of a first insulating resin film 122a and a second insulating resin film 122b. With regard to the electroconductive-layer/insulating-resin-layer structure 123, first, the second insulating resin film 122b is formed on the first insulating resin film 122a. Then, the electroconductive film 120 is formed on the second insulating resin film 122b.

With the present embodiment, the semiconductor device components 142 and the passive device components 144 are embedded within and thermally bonded to the insulating resin film 122 (see FIGS. 8A through 8D). With regard to the insulating resin film 122, the second insulating resin film 122b is formed of a material having a greater rigidity than that of the material forming the first insulating resin film 122b. Such an arrangement enables the semiconductor device components 142 and the passive device components 144 to be embedded within the first insulating resin film 122a while maintaining the profile of the insulating resin film 122 due to the rigidity thereof, during the thermal bonding step.

Figure 8A:
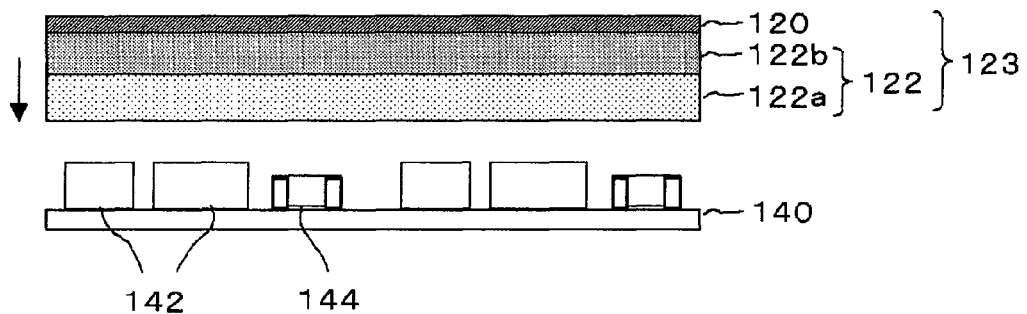
FIGS. 8A through 8D are cross-sectional diagrams which show a manufacturing process for a semiconductor module according to a fourth embodiment of the first group of the present invention.
Figure 8B:
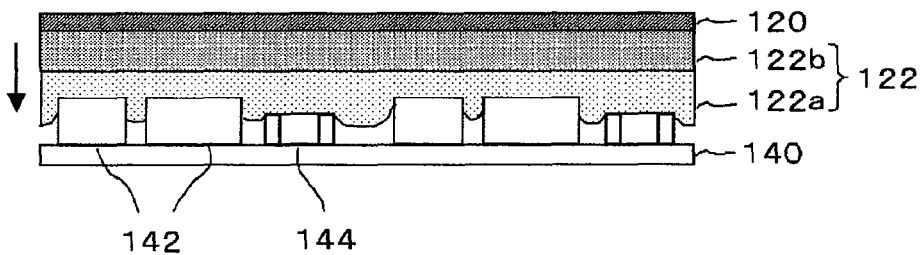
Figure 8C:
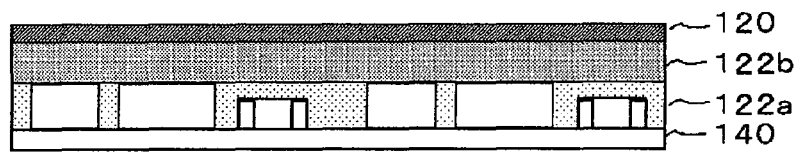
Figure 8D:
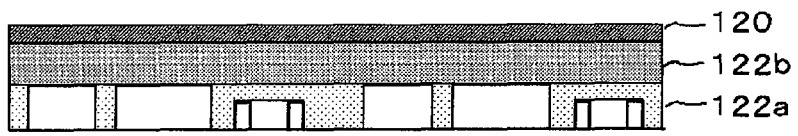

Description will be made below with reference to FIGS. 8A through 8D. First, as shown in FIGS. 8A through 8C, the electroconductive-layer/insulating-resin-layer structure 123 is applied to the substrate 140 with the multiple semiconductor device components 142 and the multiple passive device components 144 being fixed on the substrate 140, such that the semiconductor device components 142 and the passive device components 144 are embedded within the insulating resin film 122. Next, the insulating resin film 122 is heated in a vacuum or at a reduced pressure such that it adheres to the substrate 140. Subsequently, the substrate 140 is removed from the insulating resin film 122 as shown in FIG. 8D.

The first insulating resin film 122a and the second insulating resin film 122b may be formed of one of the materials described in the first embodiment as appropriate. Examples of such materials include: epoxy resin; melamine derivatives such as BT resin; liquid crystal polymer; PPE resin; polyimide resin; fluorocarbon resin; phenol resin; polyamide bismaleimide; and so forth.

Here, the first insulating resin film 122a may be formed of a material having a nature which permits the material to be easily softened as compared with the material forming the second insulating resin film 122b. With such an arrangement, in a thermal bonding step, the first insulating resin film 122a becomes more flexible than the second insulating resin film 122b. Accordingly, in this step, the semiconductor device components 142 and the passive device components 144 are embedded within the first insulating resin film 122a smoothly, while the rigidity of the second insulating resin film 122b suppresses the deformation of the overall profile of the insulating resin film 122. In such a case, the second insulating resin film 122b serves as a stopper layer for preventing the semiconductor device components 142 and the passive device components 144 from penetrating too far toward the insulating resin film 122. This maintains the constant film thickness of the insulating resin film 122. Thus, such an arrangement improves the precision with which the size of each semiconductor module is formed. Furthermore, such an arrangement improves the rigidity of the semiconductor module.

Also, the first insulating resin film 122a may be formed of a material having a lower glass-transition temperature than that of the material forming the second insulating resin film 122b. Also, as another example, the first insulating resin film 122a may be formed of a material having a greater adherence with the semiconductor device components 142 and the passive device components 144 than that of the material forming the second insulating resin film 122b. Such arrangements exhibit the same advantages as described above.

On the other hand, the first insulating resin film 122a and the second insulating resin film 122b may contain a filling material such as filler, fiber, or the like. With such an arrangement, the first insulating resin film 122a is formed with a smaller concentration of filler than that of the second insulating resin film 122b. Also, an arrangement may be made in which only the second insulating resin film 122b contains the filler, and the first insulating resin film 122a contains no filler. Such arrangements improve the flexibility of the first insulating resin film 122a, thereby facilitating a step in which the semiconductor device components 142 and the passive device components 144 are embedded within the first insulating resin film 122a. At the same time, such arrangements suppress undesired bending of the insulating resin film 122 by actions of the second insulating resin film 122b.

With the present embodiment, the first insulating resin film 122a and the second insulating resin film 122b are formed of suitable materials corresponding to the respective purposes, as described above. Such an arrangement allows the semiconductor device components 142 and the passive device components 144 to be properly embedded within the insulating resin film 122. Furthermore, such an arrangement improves the rigidity and moldability of the semiconductor module.

Figure 9:
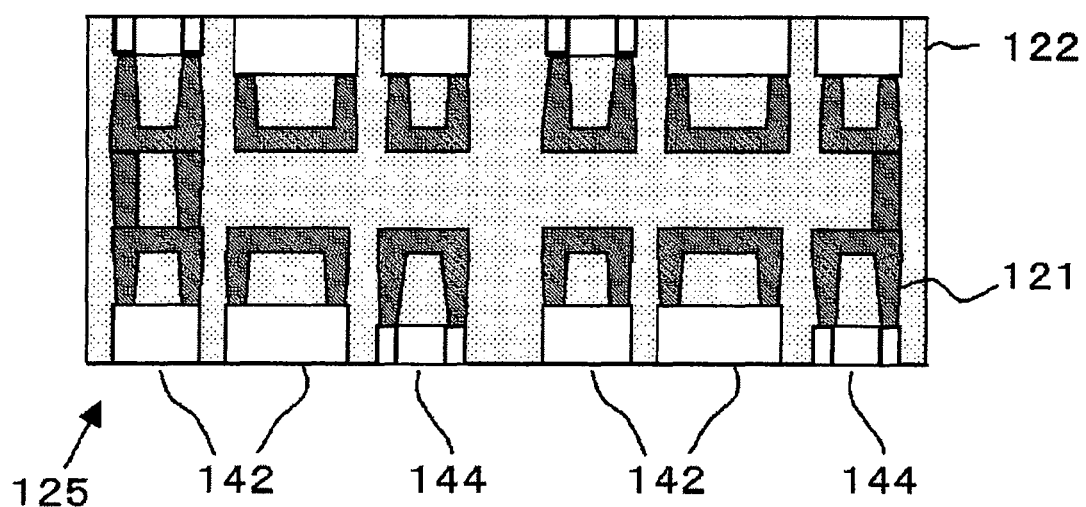
FIG. 9 is a cross-sectional diagram which shows a structure of a semiconductor module manufactured with a process described in the first through fourth embodiments of the first group of the present invention.

FIG. 9 is a cross-sectional diagram which shows a structure of the semiconductor module in which the sealed structures 125 are layered, each of which has a structure in which the semiconductor device components 142 and the passive device components 144 are embedded and sealed within the insulating resin film 122 according to the process described in the first through fourth embodiments.

FIG. 9 shows a semiconductor module manufactured as follows. That is to say, first, the electroconductive-layer/insulating-resin-layer structure 123 is thermally bonded onto the sealed structure 125. Furthermore, another sealed structure 125 is layered on the layered structure thus formed. With such an arrangement, interconnections are formed using the electroconductive film 120. The electroconductive film 120 of the upper-layer sealed structure 125 and the other electroconductive film 120 of the lower-layer electroconductive-layer/insulating-resin-layer structure 123 can be electrically connected by ambient-temperature connection or by soldering. Furthermore, through holes are formed in the insulating resin film 122 using a carbon dioxide gas laser or the like. Then, each through hole is filled with an electroconductive material, thereby forming via plugs 121. Such an arrangement effects an electric connection between the layers. Note that examples of the methods for forming the through holes include: machining; chemical etching using chemicals; and dry etching using plasma; and so forth, in addition to the carbon dioxide gas laser.

With the manufacturing method according to the present embodiment described above, a semiconductor module having a layered structure, in which the multiple sealed structures 125 are layered, can be manufactured in a simple manner. Let us consider an arrangement in which a great number of the semiconductor device components 142 and passive device components 144 are two-dimensionally arrayed on a single plane. Such an arrangement leads to an increased area of each layer. This leads to a problem of undesirable bending of the semiconductor module after a step in which these device components are sealed. On the other hand, with the present embodiment, the multiple semiconductor device components 142 and passive device components 144 are three-dimensionally layered as described above. Such an arrangement enables the area of each layer to be reduced, thereby suppressing undesirable bending of the semiconductor module.

As described above, multiple circuit components are sealed by thermal bonding using the electroconductive-layer/insulating-resin-layer structure 123. Such an arrangement improves the adhesion between each of the multiple circuit components and the electroconductive-layer/insulating-resin-layer structure 123. This allows the circuit components to be sealed without using any adhesive material such as solder resist, die paste, or the like, which is necessary for sealing the multiple circuit components with a transfer mold method. This enables the size of the semiconductor module to be reduced. Furthermore, such an arrangement is formed without using any adhesive material, thereby improving the electric properties of the semiconductor module.

Let us consider an arrangement in which circuit components are sealed using a die with a transfer mold method or the like. In this case, multiple semiconductor modules are sealed at the same time. Then, dicing or the like is performed such that the semiconductor modules are divided into separate units. With such a method, the area of the plane perpendicular to the thickness is large, leading to a problem that the semiconductor modules readily bend. With the present embodiment, sealing processing is performed for each semiconductor module in a simple manner. This reduces the area of the plane on which the components to be sealed are arrayed. This suppresses bending of each semiconductor module. Accordingly, this enables the amount of filler contained in the resin to be reduced, thereby improving the adherence between the components and the resin.

(Fifth Embodiment)

FIGS. 10A through 10E, and FIGS. 11A and 11B, are cross-sectional diagrams which show a manufacturing process for a semiconductor module according to a fifth embodiment of the first group of the present invention.

The difference between the present embodiment and the first through fourth embodiments is as follows. That is to say, first, the multiple semiconductor device components 142 and passive device components 144, which are of different heights, are fixed within resin with the face thereof being flat. Then, the electroconductive-layer/insulating-resin-layer structure 123 is thermally bonded onto the semiconductor device components 142 and the passive device components 144. Such an arrangement further improves the adherence between the insulating resin film 122 of the electroconductive-layer/insulating-resin-layer structure 123 and each of the semiconductor device components 142 and the passive device components 144.

Figure 10A:
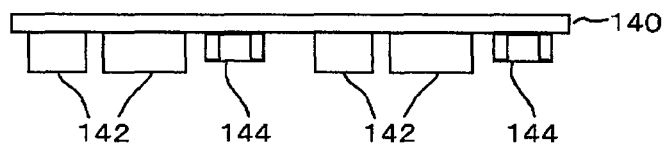
FIGS. 10A through 10E are cross-sectional diagrams which show a manufacturing process for a semiconductor module according to a fifth embodiment of the first group of the present invention.
Figure 10B:
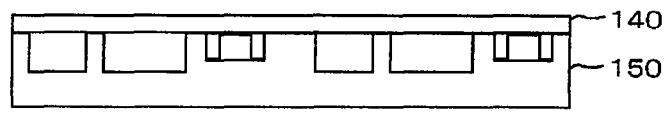
Figure 10C:
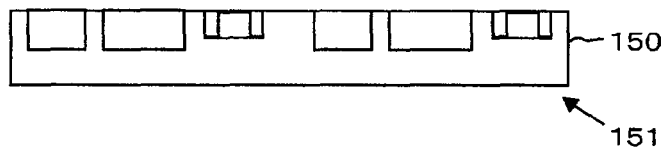

First, as shown in FIG. 10O, a substrate 151 in which the multiple semiconductor device components 142 and passive device components 144 are embedded is formed. The substrate 151 may be formed in the same way as described in the first through fourth embodiments. In this case, as shown in FIGS. 10A and 10B, the semiconductor device components 142 and the passive device components 144 fixed on the substrate 140 are pressed into contact with and are embedded within a resin layer 150. Then, the resin layer 150 is thermally bonded to the semiconductor device components 142 and the passive device components 144 in a vacuum or at a reduced pressure, whereby the semiconductor device components 142 and the passive device components 144 are fixed within the resin layer 150. Here, the resin layer 150 may be formed of the same material as that used to form the aforementioned insulating resin film 122. An arrangement employing such resin provides a semiconductor module with improved high-frequency properties and product reliability. Furthermore, with such an arrangement employing such a material as the insulating resin film, the rigidity of the semiconductor module can be maintained. This improves the stability of the semiconductor module. Also, the resin layer 150 may include the electroconductive film 120, which is not shown in the drawings. Subsequently, the substrate 140 is removed from the resin layer 150, thereby obtaining the substrate 151 shown in FIG. 10C. Furthermore, the resin layer 150 may be formed of the first insulating resin film 122a and the second insulating resin film 122b in the same way as described in the fourth embodiment.

Also, as another example, the substrate 151 may be formed using a die with a transfer mold method, injection mold method, potting method, dipping method, or the like.

Specifically, thermosetting resin such as epoxy resin and so forth can be employed with a transfer mold method or a potting method. On the other hand, thermoplastic resin such as polyimide resin, polyphenylene sulfide resin, and so forth, can be employed with an injection mold method.

As described above, as shown in FIG. 10C, the substrate 151 is obtained, which has a structure in which one face of each of the semiconductor device components 142 and the passive device components 144 is exposed from the substrate 151.

Figure 10D:
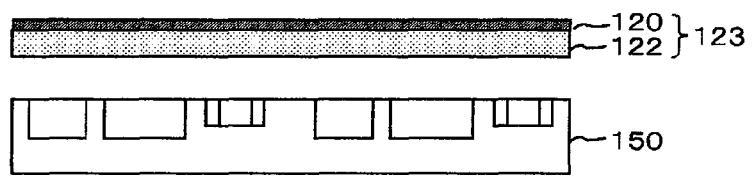
Figure 10E:
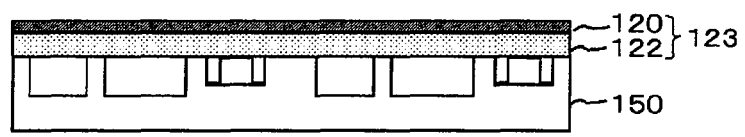

Subsequently, as shown in FIG. 10D, the electroconductive-layer/insulating-resin-layer structure 123 is applied onto the substrate 151. Then, the insulating resin film 122 is heated in a vacuum or at a reduced pressure such that it is bonded to the substrate 151, as shown in FIG. 10E.

Subsequently, a predetermined pattern is formed by etching the electroconductive film 120 using a etching resist as a mask, thereby forming a interconnection pattern. Specifically, chemical etchant is sprayed on the electroconductive film 120 having a etching resist pattern printed thereupon so that the exposed portion is removed as an unnecessary region of the electroconductive film 120, thereby forming a interconnection pattern. Conventional etching resist materials employed for manufacturing of printed wiring boards may be employed as the etching resist. Specifically, silk screen printing may be performed using resist ink. Also, a photosensitive dry film for etching resist may be employed. In this case, first, the photosensitive dry film for etching resist is laminated on the electroconductive film 120, and a photomask is overlaid thereupon with a predetermined pattern which enables light to pass therethrough so as to form a light pattern corresponding to a interconnection. Then, exposure processing is performed using ultraviolet light. Subsequently, developing is performed using a developing solution so that unexposed portions are removed, thereby forming the interconnection. Let us consider a case in which the electroconductive film 120 is formed of a copper foil. In this case, conventional chemical etchants employed for manufacturing printed wiring boards may be employed. Examples of such chemical etchants include: a solution of cupric chloride and hydrochloric acid; a ferric chloride solution; a solution of sulfuric acid and hydrogen peroxide; an ammonium persulfate solution; and so forth. With such processing, a semiconductor module is obtained having a structure in which the interconnection layer is formed on the semiconductor device components 142 and the passive device components 144.

Subsequently, through holes are formed at predetermined portions on the electroconductive-layer/insulating-resin-layer structure 123 using a carbon dioxide gas laser or the like. Then, each through hole is filled with an electroconductive material, thereby forming via plugs (denoted by reference numeral 121 in FIG. 11A). The via plugs may be formed by electroless plating or electroplating.

Figure 11A:
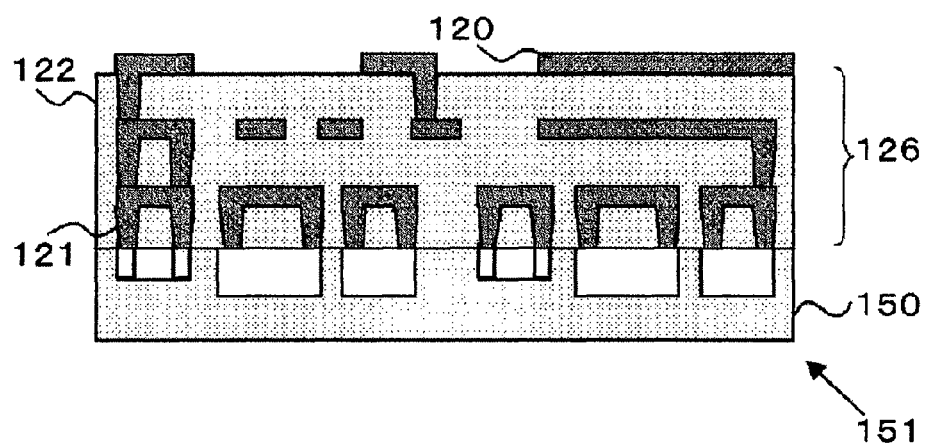
FIGS. 11A and 11B are cross-sectional diagrams which show a manufacturing process for a semiconductor module according to a fifth embodiment of the first group of the present invention.

Subsequently, the same steps are repeated. Specifically, the step in which the electroconductive-layer/insulating-resin-layer structure 123 is layered, and the step in which the electroconductive plugs are formed, are repeatedly performed. As a result, a multi-layer interconnect structure 126 formed of multiple layers is formed as shown in FIG. 11A. Thus, a semiconductor module is formed having a structure in which the multi-layer interconnect structure 126 is formed on the multiple semiconductor device components 142 and the passive device components 144.

Figure 12:
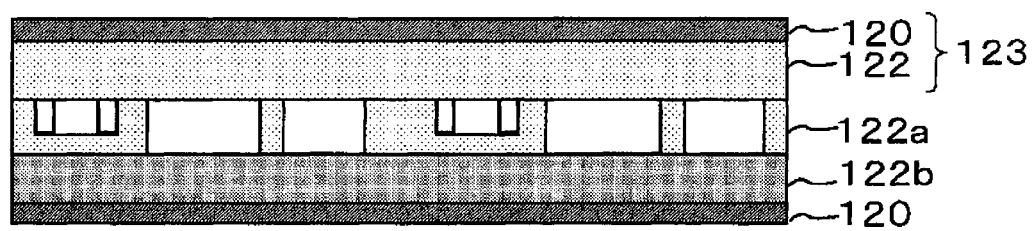
FIG. 12 is a cross-sectional diagram which shows a structure of a semiconductor module according to a fifth embodiment of the first group of the present invention.

Also, the present embodiment has the same structure in which the electroconductive-layer/insulating-resin-layer structure 123 is thermally bonded onto the semiconductor device components and the passive device components embedded within the insulating resin film formed of the first insulating resin film 122a and the second insulating resin film 122b as described in the fourth embodiment with reference to FIGS. 8A through 8D. FIG. 12 shows this structure.

The semiconductor module according to the present embodiment is manufactured as follows. First, the semiconductor device components 142 and the passive device components 144 are embedded within the resin film 150 such that the surface thereof to which the electroconductive-layer/insulating-resin-layer structure 123 is to be adhered remain flat. Then, the electroconductive-layer/insulating-resin-layer structure 123 is adhered to this face of the resin film 150. Such a manufacturing method maintains a uniform thickness over the entire insulating resin film 122 which is a component of the electroconductive-layer/insulating-resin-layer structure 123 formed on the semiconductor device components 142 and the passive device components 144 over the entire area. This improves via-hole formability in a step for manufacturing via holes using a laser.

Furthermore, with the present embodiment, processing is performed such that face thereof to which the multiple semiconductor device components 142 and passive device components 144 are to be adhered to the electroconductive-layer/insulating-resin-layer structure 123 remains flat. This improves the adherence between the insulating resin film 122 of the electroconductive-layer/insulating-resin-layer structure 123 and each of the semiconductor device components 142 and passive device components 144.

(Application to ISB Package)

Figure 11B:
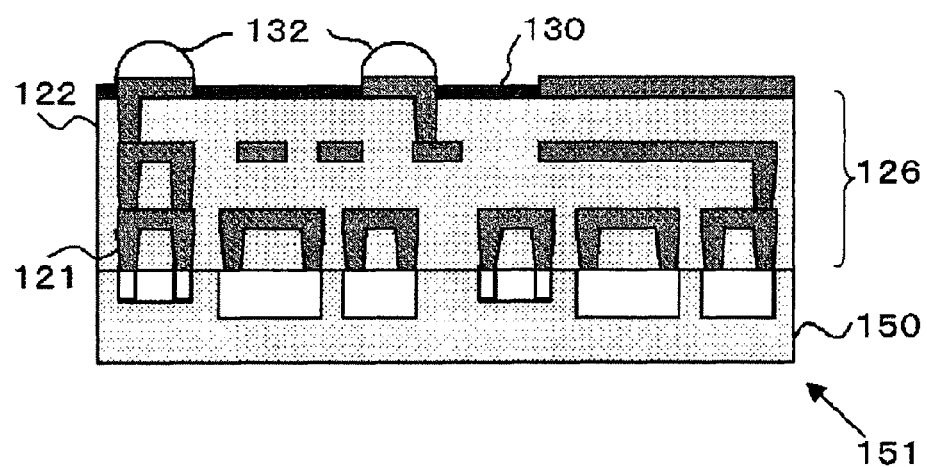

Let us consider an arrangement in which the manufacturing method for the semiconductor module according to the present embodiment is applied to the manufacture of an ISB package. In this case, first, circuit components such as the semiconductor device components 142, passive device components 144, and so forth, are sealed within the resin layer 150, thereby forming the substrate 151. Subsequently, the electroconductive-layer/insulating-resin-layer structure 123 is layered on the substrate 151 which also serves as a supporting substrate, thereby forming the multi-layer interconnect structure 126. Then, as shown in FIG. 11B, the dielectric film 130 serving as a protective layer and the solder balls 132 are provided on the electroconductive-layer/insulating-resin-layer structure 123 which is the uppermost layer, thereby forming rear-face electrodes. With the process described above, a semiconductor module having no supporting substrate can be manufactured. With the present embodiment, the substrate 151 in which the circuit components have been sealed also serves as a supporting substrate. Thus, there is no need to perform a step for removing the substrate after formation of the multi-layer interconnect structure. This simplifies the manufacturing process for the ISB package while offering the aforementioned advantages.

A material for the resin layer 150 for sealing the semiconductor device components 142 and the passive device components 144 preferably has satisfactory adherence with the semiconductor device components 142 and the passive device components 144, and preferably has a thermal expansion coefficient close to that of the semiconductor material such as Si or the like. Examples of such materials include: epoxy resin; melamine derivatives such as BT resin; liquid crystal polymer; PPE resin; polyimide resin; fluorocarbon resin; phenol resin; polyamide bismaleimide; and so forth. Furthermore, a filling material such as filler, fiber, or the like, may be added to such a material as appropriate such that the resin layer 150 comes to have a thermal expansion coefficient close to that of semiconductor material.

With the manufacturing method for the semiconductor module according to the present embodiment, the electroconductive-layer/insulating-resin-layer structure 123 is thermally bonded to the semiconductor device components 142 and the passive device components 144, thereby forming the multi-layer interconnect structure 126. This improves the adherence between the multi-layer interconnect structure 126 and each of the semiconductor device components 142 and passive device components 144. Thus, the multi-layer interconnect structure 126 can be properly adhered to the semiconductor device components 142 and the passive device components 144 without using any adhesive material such as solder resist, die paste, or the like. With the present embodiment, the ISB package contain no impurity such as the adhesive material and so forth, thereby improving the electric properties of the ISB package. Furthermore, such an arrangement enables the size of the ISB package to be reduced.

Description has been made regarding the present invention with reference to the aforementioned embodiments. The above-described embodiments have been described for exemplary purposes only, and are by no means intended to be interpreted restrictively. Rather, it can be readily conceived by those skilled in this art that various modifications may be made by making various combinations of the aforementioned components or the aforementioned processing, which are also encompassed in the technical scope of the present invention.

For example, electric connection between the interconnection layers is not restricted to a method in which each through hole is filled with an electroconductive material. Also, the interconnection layers may be electrically connected through wires. With such an arrangement, the wires may be sealed within the sealing material.

Figure 13:
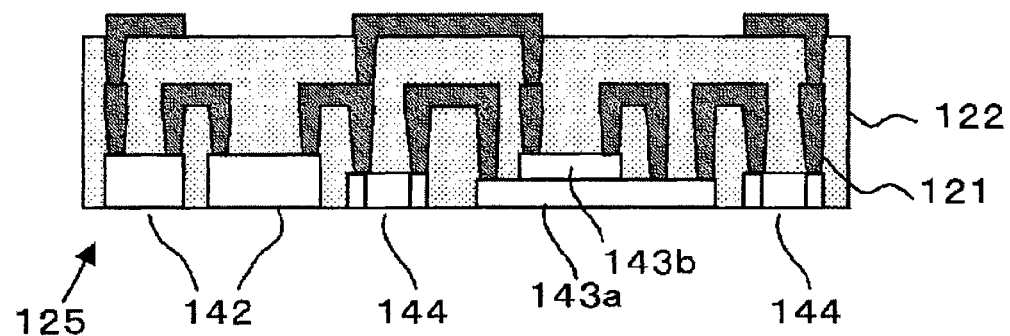
FIG. 13 is a cross-sectional diagram which shows another example of a semiconductor module according to an embodiment of the first group of the present invention.

Also, an arrangement may be made including a circuit component in which a second device component 143b is disposed on a first device component 143a, as shown in FIG. 13. Examples of such combinations, in which the second device component 143b is disposed on the first device component 143a, include, for example: a combination of SRAM and flash memory; and a combination of SRAM and PRAM. With such an arrangement, the second device component 143b disposed on the first device component 143a is electrically connected to other circuits through via plugs 121.

(Second Group)

First, description will be made regarding a damascene method employed in the present embodiment.

In recent years, as a solution for meeting the current demands such as the demand for high-speed operation of the semiconductor devices, and the demand for reduction in manufacturing costs thereof, fine multi-layer interconnection techniques are being developed. However, this leads to a problem of wiring delay (RC delay) due to the increased resistance of each interconnection and the increased capacitance between the interconnections. Such wiring delay has become a limitation of the operation speed of semiconductor devices. In order to solve the aforementioned problem, various countermeasures have become widely known. Examples of such countermeasures include: a method in which the interconnection is formed of copper (Cu) so as to reduce the electric resistance of the interconnections; a method in which the dielectric film is formed of a material having a low dielectric constant so as to reduce the electric capacitance occurring between the interconnections.

In general, there is difficulty in performing fine manufacturing of the Cu interconnections using reactive ion etching techniques. Accordingly, a damascene method is employed for manufacturing interconnections formed of Cu.

FIGS. 14A through 14D show an example of a Cu interconnection formation process using the damascene method. Currently, damascene methods are known, including a single damascene method in which the interconnection layer and the via plugs are formed in order, and a dual damascene method in which the interconnection layer and the via plugs are formed at the same time (see Japanese Patent Laid Open Publication 2000-91425). Description will be made regarding arrangements employing the latter damascene method.

Figure 14A:
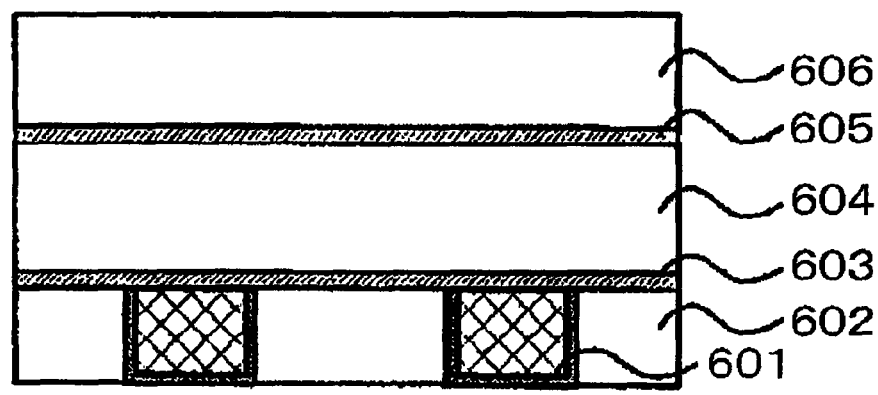
FIGS. 14A through 14D are cross-sectional diagrams which show a interconnect-formation process using a typical dual damascene method.

First, as shown in FIG. 14A, a Cu-diffusion barrier film 603, e.g., a SiN film is formed on a lower interconnection 601 containing Cu and a lower dielectric film 602 using a plasma CVD method, and then, an interlayer dielectric film 604 is formed. While with regard to the interlayer dielectric film 604, a conventionally-employed $SiO_2$ film may be formed with a plasma CVD method, the interlayer dielectric film 604 may be formed of a material having a low dielectric constant so as to further reduce the wiring delay as described above. The term "material having a low dielectric constant" as used here represents a material having a lower relative dielectric constant than that of $SiO_2$, i.e., a relative dielectric constant of around 4.1 through 4.2. Examples of such materials include: film of the SiOC group and a film of the SiOF group formed with a plasma CVD method; an organic SOG film, an inorganic SOG (Spin On Glass) film, and an organic polymer film, formed with an coating method; and so forth.

Next, an etching stopper film 605 is formed, and then, an upper dielectric film 606 is formed. The etching stopper film 605 is formed of a material having high etching selectivity such as a SiN film, SiC film, $SiO_2$ film, or the like, with respect to the upper dielectric film 606. The upper dielectric film 606 may be formed of a material having a low dielectric constant other than a $SiO_2$ film, in the same way as with the interlayer dielectric film 604.

Figure 14B:
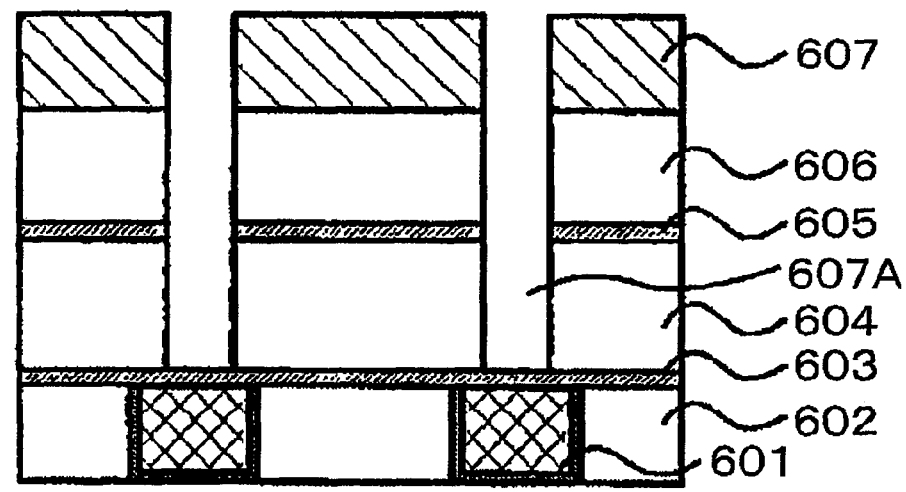
Figure 14C:
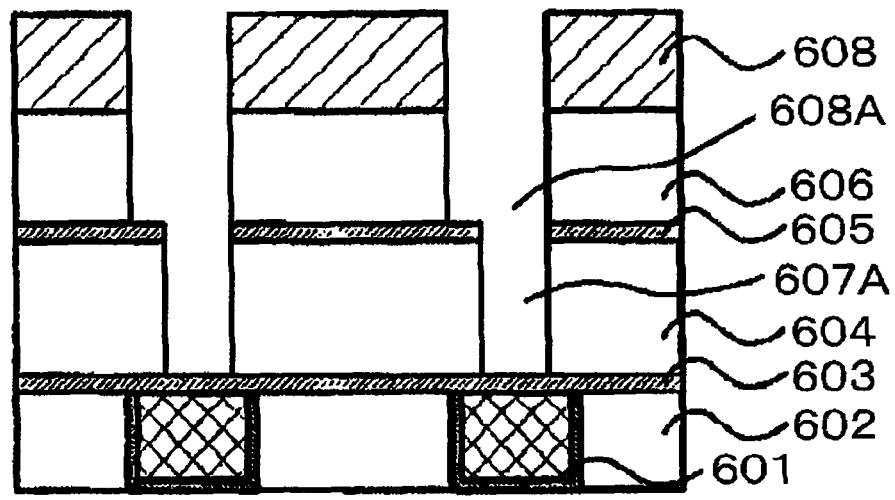
Figure 14D:
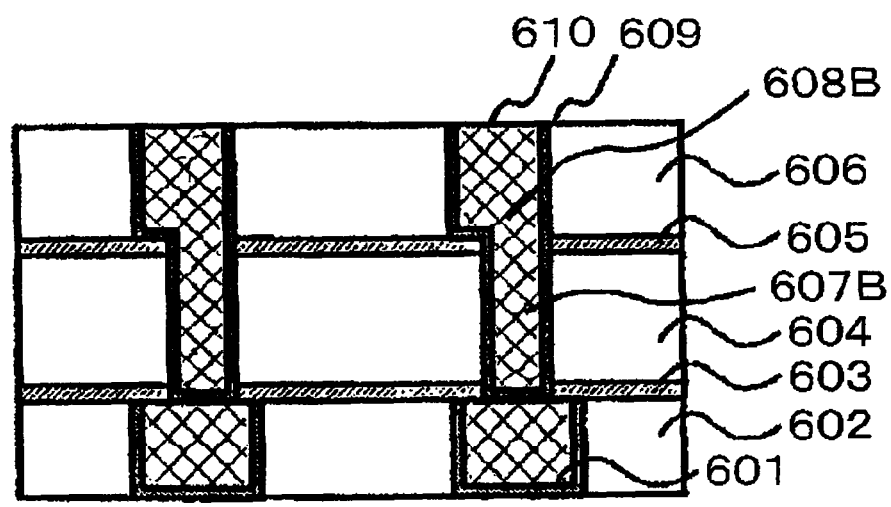

Next, as shown in FIG. 14B, anisotropic etching is performed with a hole-shaped first resist pattern 607 as a mask, thereby forming via holes 607A. After removal of the first resist pattern 607, as shown in FIG. 14C, anisotropic etching is performed with a trench-shaped second resist pattern 608 as a mask, thereby forming upper interconnect trenches 608A. In this step, the etching stopper film 605 prevents etching of the interlayer dielectric film 604.

Furthermore, after coating the inner faces of the via holes 607A and the upper interconnect trenches 608A with barrier metal 609, each via hole 607A and each upper interconnect trench 608A are filled with interconnection metal 610 such as Cu or the like. The barrier metal is formed in order to prevent the diffusion of Cu, and in order to improve the adhesion with the dielectric film. In general, the barrier metal layer is formed of high melting metal such as Ta, Ti, the nitride thereof, or the like, using a PVD method. The Cu layer is formed such that each via hole 607A and each upper interconnect trench 608A are filled with Cu, and such that it overlays the upper dielectric film 606, using plating or the like (this step is not shown in the drawings). After this step, chemical mechanical polishing (CMP) is performed, thereby forming the via plugs 607B and the upper-layer interconnections 608B. The aforementioned steps are repeatedly performed, thereby forming a multi-layer interconnect structure.

However, the aforementioned damascene method requires a step for forming interconnect trenches, and a step for filling the via holes and so forth with Cu using a plating method or the like, for each layer. This leads to long process time for forming such a multi-layer interconnect structure.

In general, there is a demand for fine manufacturing of lower-layer interconnections in order to satisfy various requirements such as high-speed operation of semiconductor devices, reduction in manufacturing costs, and reduction in the size of semiconductor devices. On the other hand, there is a demand for upper-layer interconnections, which serve as global patterns, with a large width in order to provide a stable supply of source power to multiple local interconnections. Accordingly, the lower-layer interconnection and the upper-layer interconnection are formed of different materials so as to provide their respective desirable properties.

Next, description will be made regarding the present embodiment.

FIGS. 15A, 15B, 16A, 16B, and FIGS. 17A through 17C, are cross-sectional diagrams which show a manufacturing process for a semiconductor device 700 according to the present embodiment.

Figure 15A:
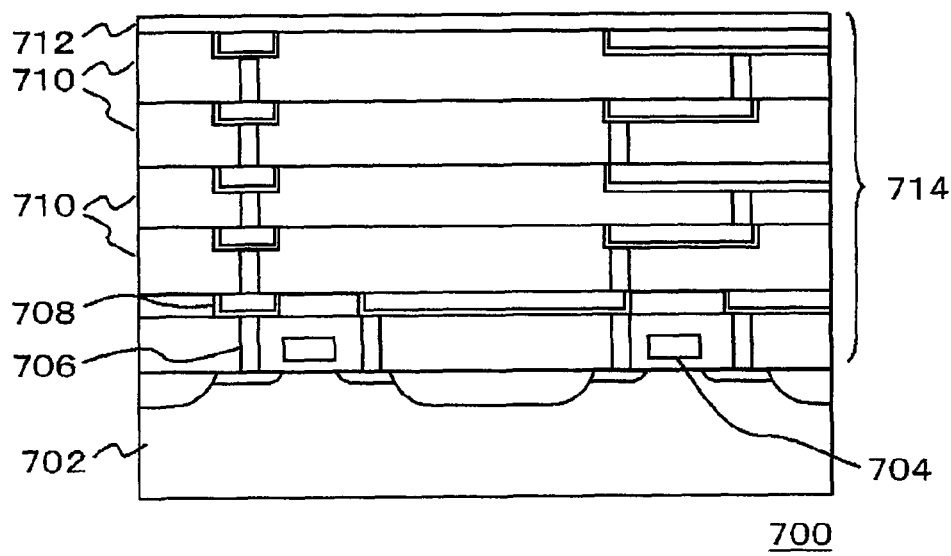
FIGS. 15A and 15B are cross-sectional diagrams which show a manufacturing process for a semiconductor device according to an embodiment of a second group of the present invention.

In the manufacturing process for the semiconductor device 700, a lower interconnection layer 714 is formed with the damascene method (FIG. 15A). Description will be made below regarding a manufacturing method for a interconnect structure using a dual damascene method.

A substrate 702 may be formed of a semiconductor material such as silicon, GaAs, or the like. Furthermore, gate electrodes 704 are formed on the substrate 702. With such an arrangement, first, an dielectric film 710 is formed on the substrate 702. The dielectric film 710 may be formed of a material having a low relative dielectric constant using a plasma CVD method or the like. Examples of such materials include: a SiO2 film; SiOC film, inorganic SOG film; MSQ; organic polymer; porous film; and so forth.

The dielectric film 710 includes a lower-layer dielectric film, in which via holes are to be formed, and a higher-layer dielectric film in which the interconnection trenches are to be formed, which are not shown in the drawings. Furthermore, an etching stopper film is formed between the lower-layer dielectric film and the upper dielectric film. The etching stopper film may be formed of a SiN film, SiC film, $SiO_2$ film, or the like, using a plasma CVD method or the like.

Subsequently, a resist film (not shown) is formed on the dielectric film 710 with a predetermined pattern. Then, etching of the dielectric film 710 is performed in order, thereby forming the interconnect trenches and via holes.

Next, a barrier metal film is formed within the via holes and the interconnect trenches using a sputtering method and a CVD method. Examples of the materials employed for forming the barrier metal include Ti, Ta, TiN, TaN, TiW, TaW, WN, and so forth. The barrier metal film may have a layered structure in which multiple layers of such materials are layered.

Subsequently, a interconnect metal film is formed on the barrier metal film. The interconnect metal film may be formed of Cu, for example. Also, the interconnect metal film may be formed of a material of interconnection having a low resistance such as Ag, AgCu, or the like. The interconnect metal film may be formed using a sputtering method, CVD method, plating method, or a combination of these methods. Specifically, let us consider an arrangement in which the interconnect metal film is formed using the sputtering method and the plating method. With such an arrangement, first, a seed metal film is deposited using a sputtering method. Next, the substrate is soaked in a plating solution, thereby forming a interconnect metal film by electroplating. The substrate may be annealed after plating. This increases the particle size of metal within the interconnect metal film as compared with that before annealing, thereby reducing the resistance of interconnect metal film.

Subsequently, the unnecessary portion of the barrier metal film and the interconnection metal film formed in the regions other than the interconnect trenches is removed using the CMP method. Thus, the plugs 706 and the interconnections 708 are formed.

Next, a diffusion barrier film (not shown) is provided on the interconnection 708. The diffusion barrier film may be formed of a SiN film, SiC film, or the like, using a plasma CVD method. Also, the diffusion barrier film may have a layered structure of SiO2/SiN, SiC/SiN, SiO2/SiCN, or the like.

Also, a cap film formed of SiN, SiC, SiO2, or the like, may be formed on the dielectric film 710 before formation of the interconnect metal film. This prevents defects occurring in the dielectric film 710 in the CMP step.

The above steps are repeatedly performed such that the interconnection layers are layered, thereby forming a multi-layer interconnect structure having two or more interconnection layers. While description has been made regarding a manufacturing method for a interconnect structure using the dual damascene method, the present embodiment may be applied to an arrangement using the single damascene method in the same way.

As the uppermost layer of the lower interconnection layer 714, a surface film 712 may be formed. Here, the surface film 712 is formed of polyimide. Such a surface film 712 thus provided protects the surface of the lower interconnection layer 714, thereby improving the reliability of the semiconductor device 700. Furthermore, the surface film 712 improves the adherence between an upper interconnection layer described later and the lower interconnection layer 714.

Figure 15B:
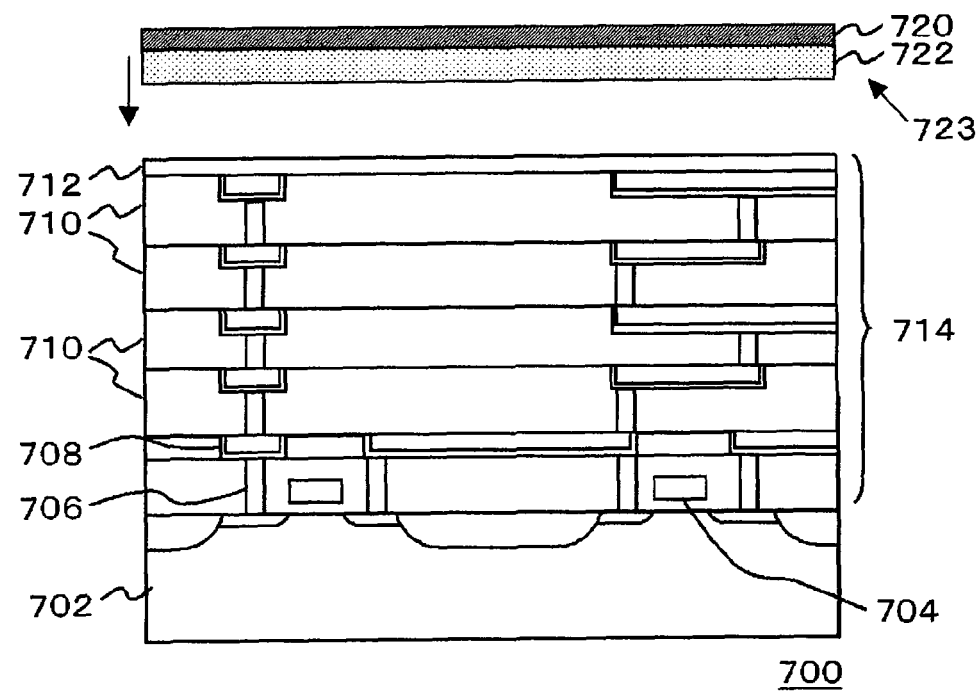
Figure 16A:
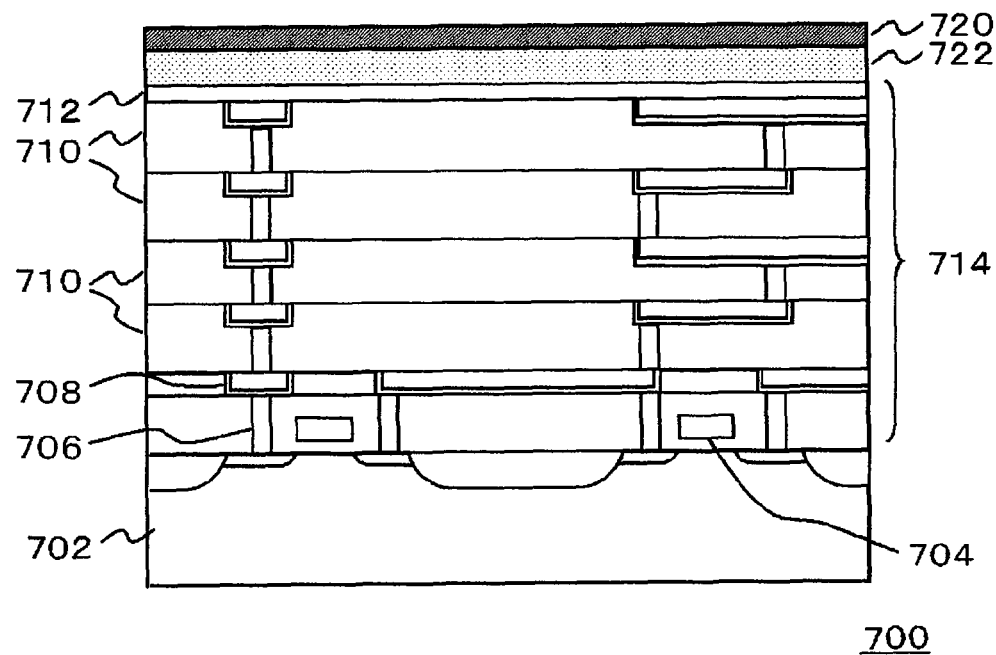
FIGS. 16A and 16B are cross-sectional diagrams which show a manufacturing process for a semiconductor device according to an embodiment of the second group of the present invention.

After formation of the lower interconnection layer 714 as described above, an electroconductive-layer/insulating-resin-layer structure 723 formed of an electroconductive film 720 and an insulating resin film 722 is applied onto the lower interconnection layer 714. Then, the insulating resin film 722 is heated in a vacuum such that it is bonded and adhered onto the lower interconnection layer 714 (FIGS. 15B and 16A). The electroconductive-layer/insulating-resin-layer structure 723 can be thermally bonded to the lower interconnection layer 714 by heating the insulating resin film 722 in the B-stage state up to a temperature equal to or greater than the glass-transition temperature of the resin forming the insulating resin film 722. The electroconductive film 720 may be formed of metal containing crystal particles having the major axis approximately perpendicular to the layered direction of the substrate. For example, rolled metal may be employed as such metal. Examples of the rolled metal include copper foil, for example. Such an arrangement thus employing such rolled metal as the material of interconnection of the upper interconnection layer prevents contamination by impurities such as gas and so forth, which occurs in the process of forming interconnect members with a sputter method, CVD method, plating method, or the like. This provides the manufacturing process without annealing processing for removing such impurities. Such a manufacturing process without heating for annealing processing enables the upper interconnection layer to be formed without damaging the device performance of the lower interconnection layer 714. This improves the stability of the semiconductor device. Also, the aforementioned metal containing crystal particles having the major axis approximately perpendicular to the layered direction of the substrate may be a pressed metal film formed with an electroplating method.

The insulating resin film 722 may be formed of any material having a nature which permits the material to be softened by heating. Specifically, examples of such materials include: epoxy resin; melamine derivatives such as BT resin; liquid crystal polymer; PPE resin; polyimide resin; fluorocarbon resin; phenol resin; polyamide bismaleimide; and so forth. An arrangement employing such materials improves the rigidity of the semiconductor device 700, thereby improving the stability of the semiconductor device 700. In particular, an arrangement in which the insulating resin film 722 is formed of thermosetting resin such as epoxy resin, BT resin, PPE resin, polyimide resin, fluorocarbon resin, phenol resin, polyamide bismaleimide, and so forth, further improves the rigidity of the semiconductor device 700.

Examples of the epoxy resin include: bisphenol A type resin; bisphenol F type resin; bisphenol S type resin; phenol novolac resin; cresol novolac type epoxy resin; trisphenol-methane-type epoxy resins; alicyclic epoxy resin; and so forth. Examples of the melamine derivative include: melamine; melamine cyanurate; methylol-melamine; (iso) cyanuric acid; melam; melem; melon; succino-guanamine; melamine sulfate; aceto-guanamine sulfate; melam sulfate; guanyl-melamine sulfate; melamine resin; BT resin; cyanuric acid; iso-cyanuric acid; iso-cyanuric acid derivative; melamine iso-cyanurate; benzo-guanamine; melamine derivatives such as aceto-guanamine and so forth; guanidino compounds; and so forth.

Examples of the liquid crystal polymer include: aromatic liquid crystal polyester; polyimide; polyesterimide; and compositions containing such materials. Of these materials, liquid crystal polyester or a composition containing liquid crystal polyester is preferably employed since such a material exhibits well-balanced properties such as heat resistance, workability, and hygroscopicity.

Examples of the liquid crystal polyester includes: 1) a material obtained by a reaction between aromatic dicarboxylic acid, aromatic diol, and aromatic hydroxy carboxylic acid; (2) a material obtained by a reaction between different kinds of aromatic hydroxy carboxylic acid; (3) a material obtained by a reaction between aromatic dicarboxylic acid and aromatic diol; (4) a material obtained by a reaction between polyester such as polyethylene terephthalate and aromatic hydroxy carboxylic acid; and so forth. Note that the ester derivative thereof may be employed, instead of the aforementioned aromatic dicarboxylic acid, aromatic diol, and aromatic hydroxy carboxylic acid. Also, materials in which the aromatic part of the aforementioned aromatic dicarboxylic acid, aromatic diol, and aromatic hydroxy carboxylic acid, are replaced by a halogen atom, alkyl group, or aryl group, may be employed.

Examples of the repeating structure units of the aforementioned crystal polyester include: a repeating structure unit derived from aromatic dicarboxylic acid (the following Expression (i)); a repeating structure unit derived from aromatic diol (the following Expression (ii)); and a repeating structure unit derived from aromatic hydroxy carboxylic acid (the following Expression (iii)).

$$-CO-A1-CO- \quad (i)$$

(here, A1 represents a ligand with a valence of 2 containing an aromatic ring)

$$-O-A2-O- \quad (ii)$$

(here, A2 represents a ligand with a valence of 2 containing an aromatic ring)

$$-CO-A3-O- \quad (iii)$$

(here, A3 represents a ligand with a valence of 2 containing an aromatic ring)

On the other hand, the insulating resin film 722 may contain fillers, fibers, or the like, for adjusting the thermal expansion coefficient thereof to be close to that of the substrate 702, and those of the dielectric film 710, the interconnection 708, the plugs 706, and so forth, which are components of the lower interconnection layer 714. Examples of the filler include $SiO_2$, SiN, AlN, $Al_2O_3$, and so forth, in the form of particles or fibers. Such an arrangement expands the range of possible materials that can be selected for the insulating resin film 722 from various kinds of materials. The content of the filler contained in the insulating resin film 722 is determined as appropriate corresponding to the material. The content of the filler contained in the insulating resin film 722 is preferably determined such that it adjusts the thermal expansion coefficient of the insulating resin film 722 to be within a suitable range, and such that it maintains the adherence between the insulating resin film and the uppermost layer of the lower interconnection layer 714 within a permissible range. Such an arrangement suppresses bending of the insulating resin film 722 in the step of cooling the insulating resin film 722 to room temperature, after the step in which the insulating resin film 722 is heated such that it adheres to the lower interconnection layer 714. This prevents undesirable separation of the insulating resin film 722 from the lower interconnection layer 714. Furthermore, the insulating resin film 722 containing such fibers exhibits improved fluidity. This improves the adherence between the insulating resin film 722 and the lower interconnection layer 714 while suppressing bending of the insulating resin film 722 as described above. Accordingly, from this perspective, an aramid non-woven fabric is preferably employed as a material contained in the insulating resin film 722. This improves the workability thereof.

Para-aramid fiber or meta-aramid fiber may be employed as the aramid. Examples of the para-aramid fiber include poly(p-phenylene-terephthalamide) (PPD-T), for example. Examples of the meta-aramid fiber include poly(m-phenylene isophthalamide) (MPD-I), for example.

The electroconductive-layer/insulating-resin-layer structure 723 may be formed by adhering the electroconductive film 720 onto the insulating resin film 722. Also, the electroconductive-layer/insulating-resin-layer structure 723 may be formed by coating a resin composition, which is a raw material of the insulating resin film 722, to the electroconductive film 720 and drying the resin composition thus coated. With the present embodiment, the resin composition may contain a hardening agent, hardening accelerator, and other components, without departing from the scope of the objects of the present embodiment. The electroconductive-layer/insulating-resin-layer structure 723 is applied onto the lower interconnection layer 714 with the insulating resin film 722 being in the B-stage state. Such an arrangement improves the adherence between the insulating resin film 722 and the lower interconnection layer 714. Subsequently, the insulating resin film 722 is heated corresponding to the kind of resin forming the insulating resin film 722. In this step, the electroconductive-layer/insulating-resin-layer structure 723 is adhered to the lower interconnection layer 714 in a vacuum or at reduced pressure. Also, another manufacturing method may be employed as follows. That is to say, first, the insulating resin film 722 in the B-stage state is applied onto the lower interconnection layer 714. Then, the electroconductive film 720 is further applied onto the insulating resin film 722. Subsequently, at the time of thermally adhering the insulating resin film 722 to the lower interconnection layer 714, the electroconductive film 720 is thermally bonded to the insulating resin film 722, thereby forming the electroconductive-layer/insulating-resin-layer structure 723 on the lower interconnection layer 714. In a case of employing a copper foil as the electroconductive film 720, positioning of the electroconductive-layer/insulating-resin-layer structure 723 is performed with respect to the lower interconnection layer 714 using X-ray.

Subsequently, a predetermined pattern is formed by etching the electroconductive film 720 using a etching resist as a mask, thereby forming a interconnection layer. Specifically, chemical etchant is sprayed on the electroconductive film 720 having a resist pattern thereupon so that the exposed portion is removed as an unnecessary region of the electroconductive film 720, thereby forming a interconnection. Conventional etching resist materials employed for manufacturing of printed wiring boards may be employed as the etching resist. Specifically, silk screen printing may be performed using resist ink. Also, a photosensitive dry film for etching resist may be employed. In this case, first, the photosensitive dry film for etching resist is laminated on a copper foil, and a photomask is overlaid thereupon with a predetermined pattern which enables light to pass therethrough so as to form a light pattern corresponding to a interconnection. Then, exposure processing is performed using ultraviolet light. Subsequently, developing is performed using a developing solution so that unexposed portions are removed, thereby forming the interconnection. Let us consider a case in which the electroconductive film 720 is formed of a copper foil. In this case, conventional chemical etchants employed for manufacturing printed wiring boards may be employed. Examples of such chemical etchants include: a solution of cupric chloride and hydrochloric acid; a ferric chloride solution; a solution of sulfuric acid and hydrogen peroxide; an ammonium persulfate solution; and so forth.

Figure 16B:
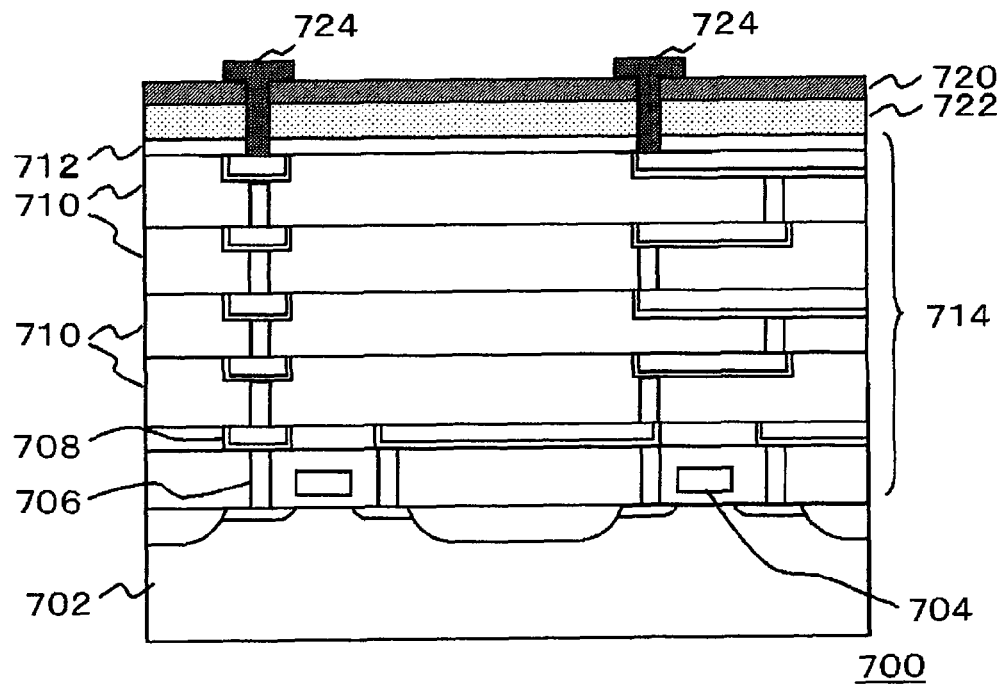

Subsequently, through holes are formed at predetermined portions on the electroconductive-layer/insulating-resin-layer structure 723 by etching. Then, each through hole is filled with an electroconductive material, thereby forming electroconductive plugs 724. The electroconductive plugs 724 may be formed by electroless plating or electroplating (FIG. 16B).

Figure 17A:
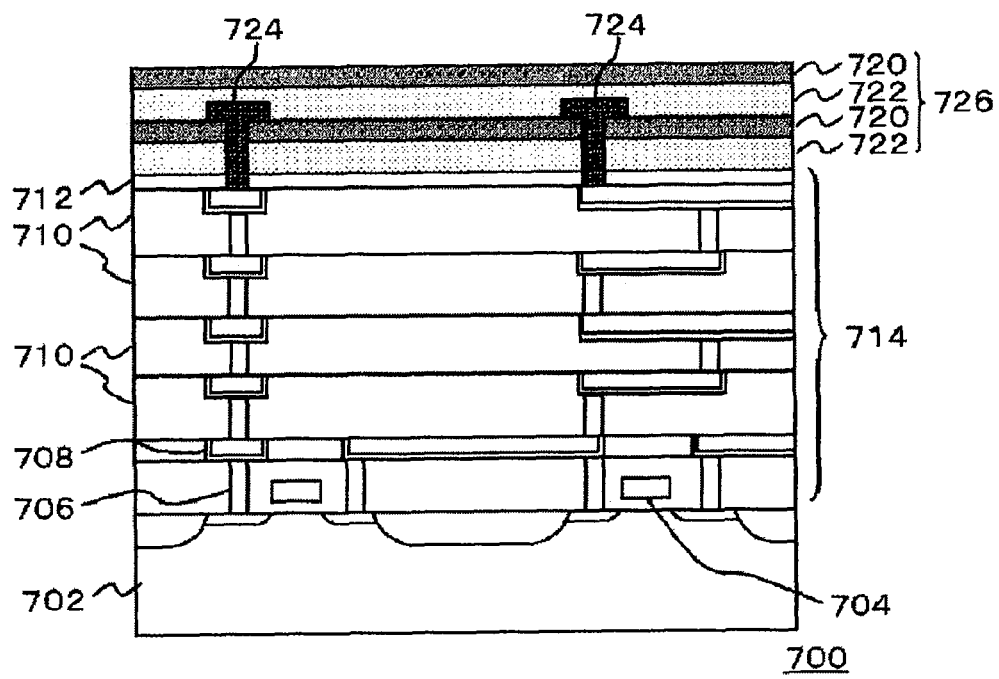
FIGS. 17A through 17C are cross-sectional diagrams which show a manufacturing process for a semiconductor device according to an embodiment of the second group of the present invention.
Figure 17B:
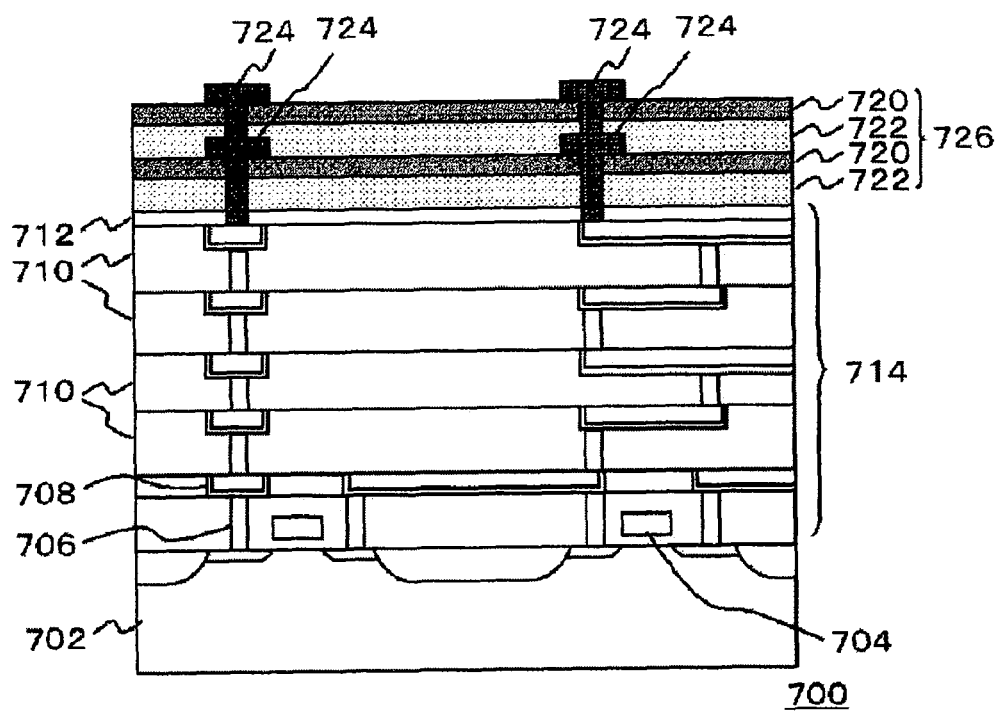
Figure 17C:
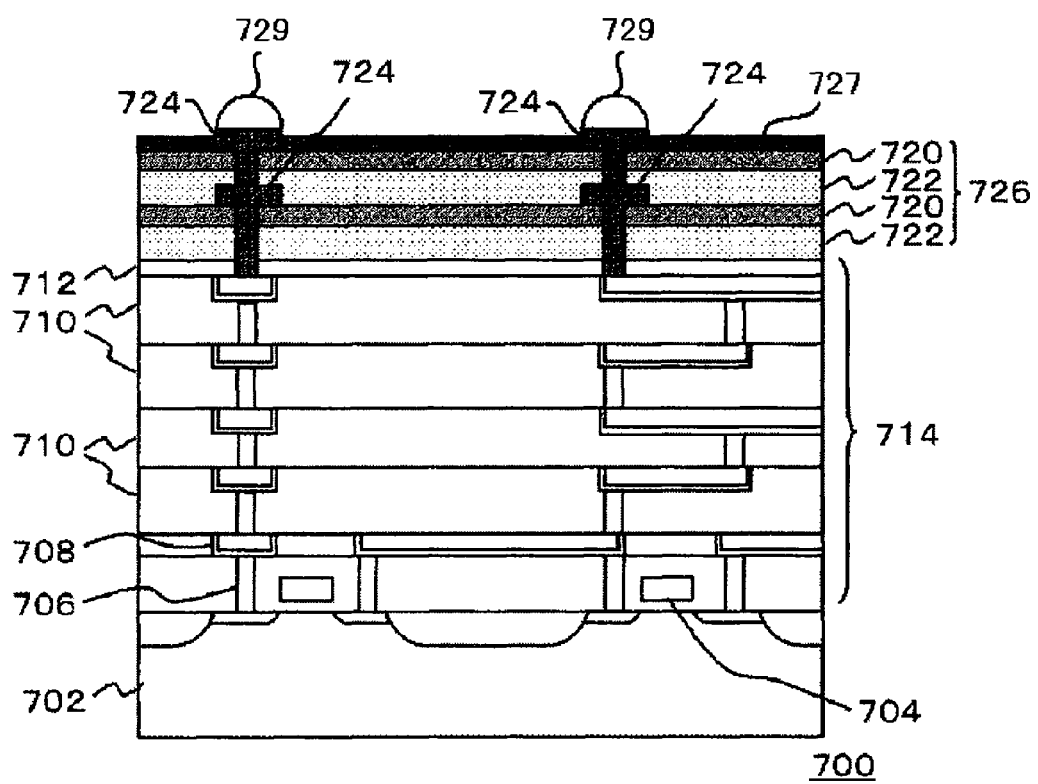

Subsequently, the same steps are repeated. Specifically, the step in which the electroconductive-layer/insulating-resin-layer structure 723 is adhered to the semiconductor device 700, and the step in which the electroconductive plugs 724 are formed, are repeatedly performed. Thus, the upper interconnection layer 726 having a multi-layer structure is formed (FIGS. 17A and 17B). Subsequently, an dielectric film 727 which is a protective layer is formed on the upper face of the upper interconnection layer 726. Then, solder balls 729 are formed on the upper faces of the electroconductive plugs 724 (FIG. 17C).

Here, the upper interconnection layer 726 has a interconnects of 10 µm through 20 µm in width, for example, which is greater than that of lower interconnection layer 714 (e.g., 0.13 µm). Accordingly, there is no need to employ fine manufacturing techniques such as a damascene method. Instead of such a damascene method, a interconnection can be formed by etching the electroconductive film 720 to form a predetermined pattern. Such a method simplifies the manufacturing process for the upper interconnection layer 726, thereby greatly reducing the processing time for the semiconductor device 700.

Figure 18:
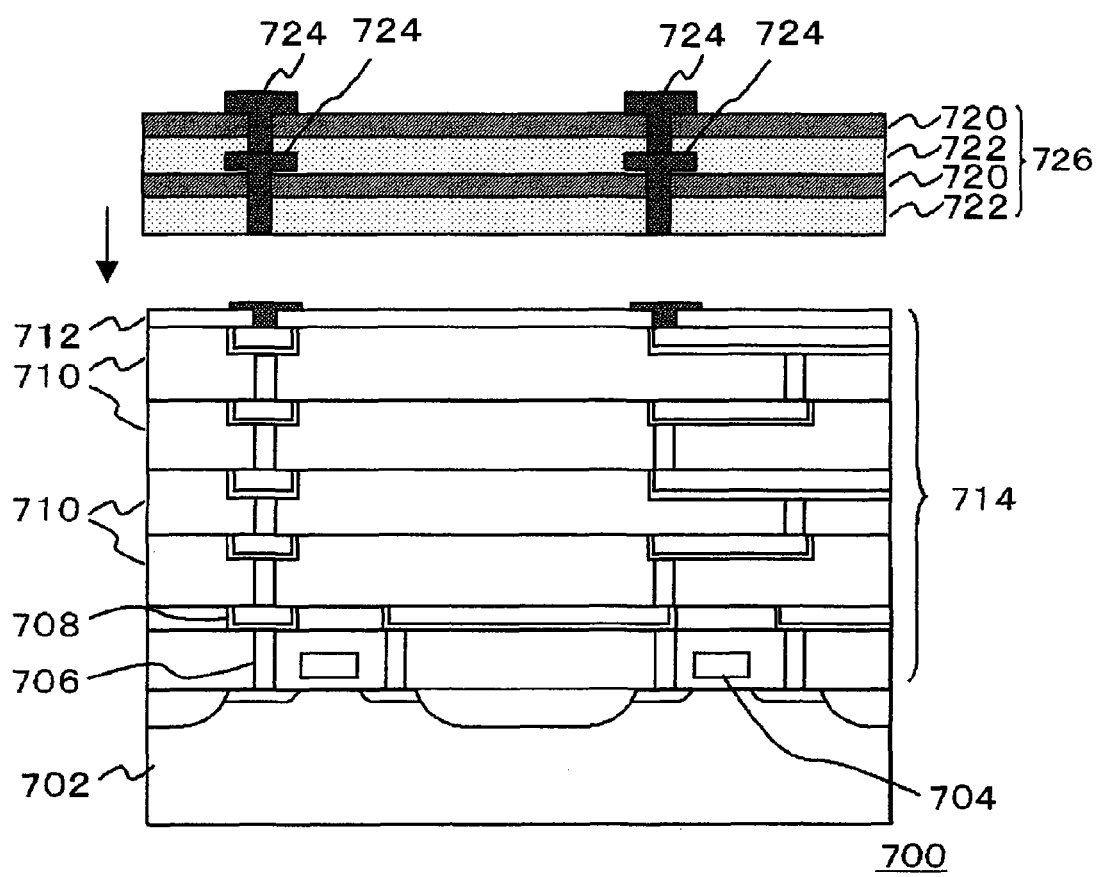
FIG. 18 is a cross-sectional diagram which shows another example of a manufacturing process for a semiconductor device according to an embodiment of the second group of the present invention.
Figure 19:
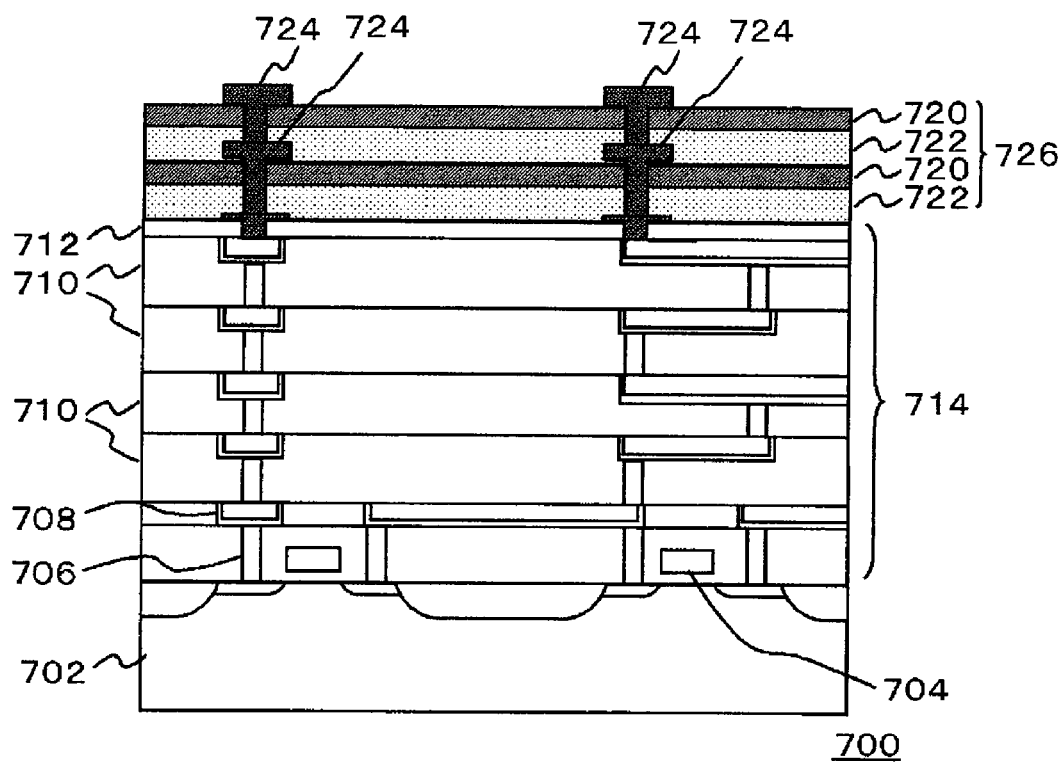
FIG. 19 is a cross-sectional diagram which shows another example of a manufacturing process for a semiconductor device according to an embodiment of the second group of the present invention.

FIGS. 18 and 19 are cross-sectional diagrams which show another example of the manufacturing process for the semiconductor device 700, which is different from the manufacturing process shown in FIGS. 15A through 17C.

With the present manufacturing process, as shown in FIG. 18, the interconnect structure of the upper interconnection layer 726 is formed before adhesion of the upper interconnection layer 726 onto the lower interconnection layer 714. The upper interconnection layer 726 having the interconnect structure thus formed is thermally bonded onto the lower interconnection layer 714, thereby manufacturing the semiconductor device 700 as shown in FIG. 19.

Such a manufacturing method enables the interconnect structure of the upper interconnection layer 726 to be formed, separate from the lower interconnection layer 714. This expands the range of possible chemicals and so forth that can be used for manufacturing the interconnect structure of the upper interconnection layer 726. Furthermore, this expands the range of materials that can be used for forming the upper interconnection layer 726 as appropriate corresponding to the desired properties required for the upper interconnection layer 726. The interconnect structure of the upper interconnection layer 726 is preferably formed giving consideration to thermal contraction which occurs in the thermal bonding, in a case that the upper interconnection layer 726 having a interconnect structure formed beforehand is thermally bonded onto the lower interconnection layer 714.

Figure 20:
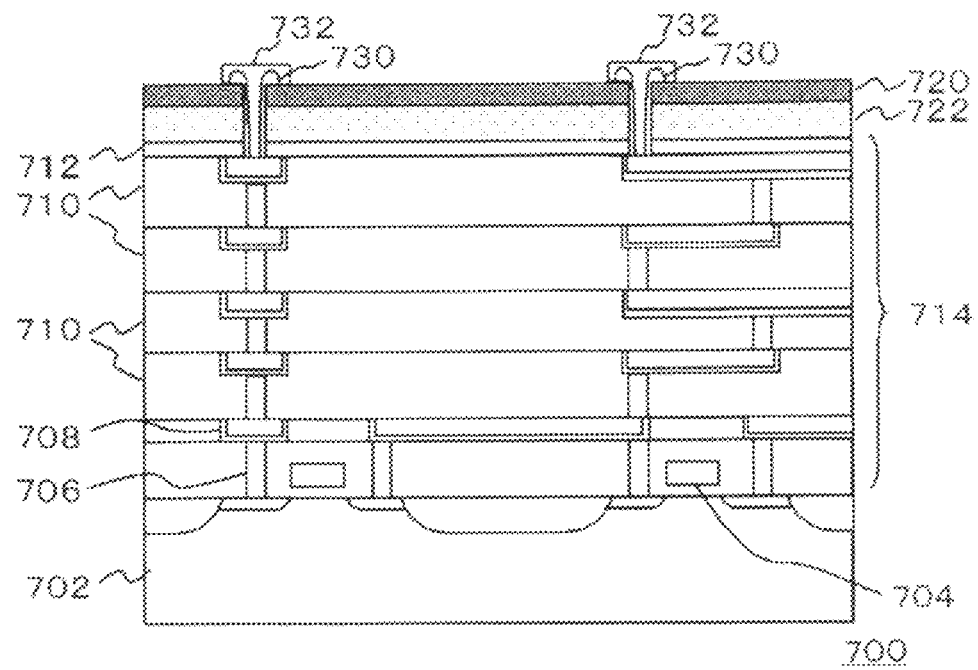
FIG. 20 is a cross-sectional diagram which shows another example of a semiconductor device according to an embodiment of the second group of the present invention.

FIG. 20 is a cross-sectional diagram which shows yet another example of the manufacturing process for the semiconductor device 700, which is different from the manufacturing process shown in FIGS. 16A through 17C. As shown in the drawing, the interconnection 708 of the lower interconnection layer 714 may be electrically connected to the electroconductive film 720 through wires 730. With such an arrangement, the wires 730 are covered with a sealing material 732.

EXAMPLES

A lower interconnection layer was formed using the dual damascene method, and a polyamide film was formed as an uppermost layer of the lower interconnection layer, as described above with reference to FIGS. 15A and 15B. Subsequently, an epoxy resin film (in the B-stag state), which contained aramid fiber and to one face of which a rolled copper foil had been adhered, was applied onto the lower interconnection layer. The lower interconnection layer was then heated at a temperature of 185° C. in a vacuum, whereby the epoxy resin film was thermally bonded to the polyamide film of the lower interconnection layer.

Figure 21:
FIG. 21 is a cross-sectional view (OM photograph) of a semiconductor device manufactured using a manufacturing method according to an embodiment of the second group of the present invention.

FIG. 21 shows an OM photograph of the semiconductor device 700 thus obtained. In the figure, reference character "A" indicates the rolled copper foil. Reference character "B" indicates the epoxy resin. The aramid fiber is shown in the portion indicated by reference character "B". Reference character "C" indicates the lower interconnection layer. As shown in FIG. 21, the epoxy resin film was properly adhered to the polyamide film of the lower interconnection layer. Also, it has been confirmed that the rolled copper foil, adhered to the aramid fiber, has crystal particles with a grain extending in the horizontal direction due to the rolling processing.

Description has been made regarding the present invention with reference to the aforementioned embodiments. The above-described embodiments have been described for exemplary purposes only, and are by no means intended to be interpreted restrictively. Rather, it can be readily conceived by those skilled in this art that various modifications may be made by making various combinations of the aforementioned components or the aforementioned processing, which are also encompassed in the technical scope of the present invention.

Description has been made regarding the damascene method employing Cu as a material of interconnection of the lower interconnection layer 714. Also, Al may be employed as the material of interconnection of the lower interconnection layer 714. In this case, the interconnection 708 of the lower interconnection layer 714 is formed by dry etching, instead of the damascene method. Even in this case, the material of interconnection of the upper interconnection layer 726 may also be formed of Cu using the electroconductive-layer/insulating-resin-layer structure 723, for example. With such an arrangement, the interconnection in the upper interconnection layer 726 can be formed of Cu, which exhibits a high electromigration resistance, thereby improving the reliability of the interconnection.

On the other hand, description has been made in the aforementioned embodiment regarding an arrangement in which the lower interconnection layer 714 and the upper interconnection layer 726 each include multiple layers. Also, the lower interconnection layer 714 and the upper interconnection layer 726 each include a single layer. Also, the lower interconnection layer 714 may comprise a logic circuit, memory, or a combination of these components.

(Third Group)

First, description will be made regarding a display device which is the base of the present embodiment.

In recent years, development of display devices which replaces CRTs has been ongoing. Examples of such display devices include: liquid crystal display (LCD); organic light emitting diode (OLED); plasma display (PDP); and so forth.

For example, Japanese Patent Laid Open Publication H11-24606 discloses a display device including light-emission device components such as electroluminescent device components or LED device components. With such an arrangement, the periphery of the transparent substrate serving as a base includes a data driving circuit for outputting image signals, a scan driving circuit for outputting scan signals, and a testing circuit. Furthermore, mounting pads are formed on the outer region of the transparent substrate on the outside of the data driving circuit, as terminals which enable image signals, various kinds of electric potentials, and pulse signals, to be input.

Conventionally, the circuits and pads are two-dimensionally provided on the periphery of the substrate. This leads to a problem of an increase in the size of the display device.

Next, description will be made regarding the present embodiment.

(First Embodiment)

Figure 22A:
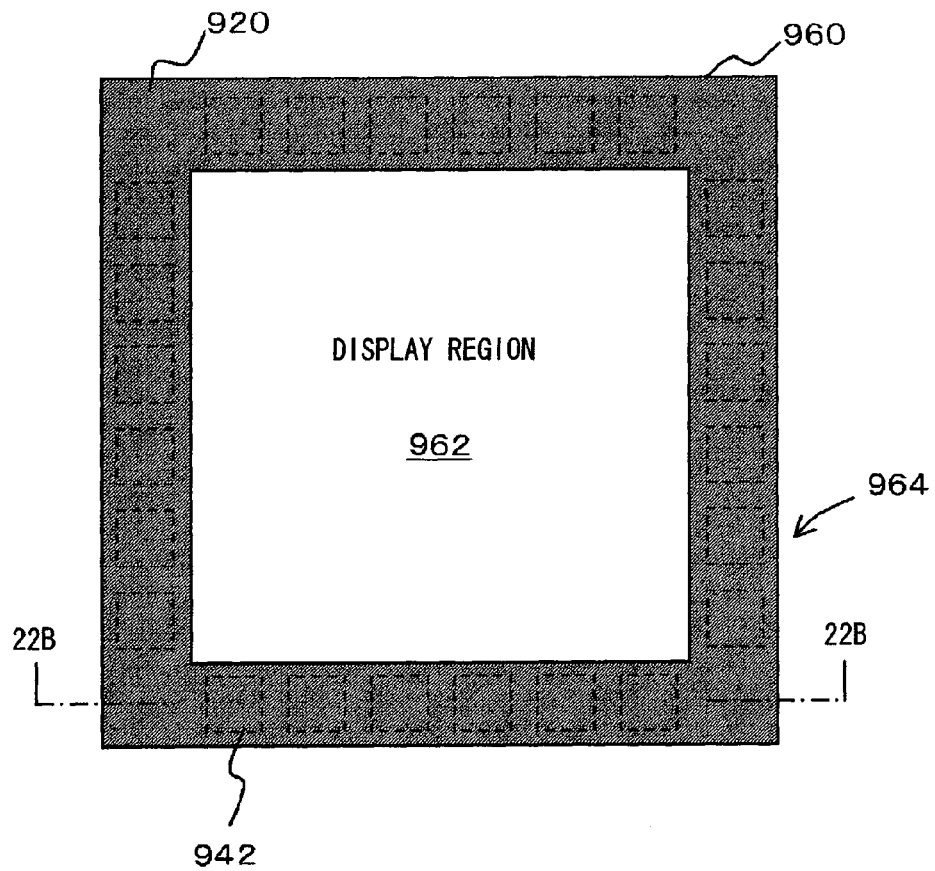
FIG. 22A is a top view which shows a structure of a display device according to a first embodiment of a third group of the present invention.
Figure 22B:
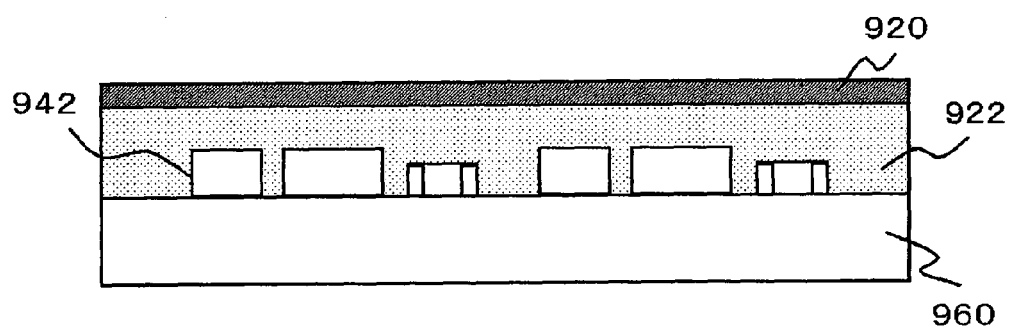
FIG. 22B is a cross-sectional view which shows a structure of a display device according to the first embodiment of the third group of the present invention.

FIGS. 22A and 22B are diagrams which show a configuration of a display device according to a first embodiment of the third group of the present invention.

FIG. 22A is a top view of a display device 900. FIG. 22B is a cross-sectional view taken along line 22B-22B in FIG. 22A.

The display device 900 includes a display region 962 which includes multiple electro-optic device components (not shown) for displaying an image formed by the electro-optic device components, and a driving circuit region 964 which is provided in the periphery the display region 962 and in which a driving circuit is formed for driving the electro-optic device components. Examples of such electro-optic device components include those for: liquid crystal display (LCD); organic light emitting diode (OLED); plasma display (PDP); and so forth. Description will be made below regarding an arrangement employing organic light emitting diodes as the electro-optic device components.

The display device 900 includes a glass substrate 960, multiple circuit components 942 provided thereon, an insulating resin film 922 which has been bonded onto the glass substrate 960 and the circuit components 942, and an electroconductive film 920 provided on the insulating resin film 922. The glass substrate 960 may be formed of quartz glass, non-alkali glass, or the like. The multiple circuit components 942, the insulating resin film 922, and the electroconductive film 920, are provided in the driving circuit region 964. Examples of the circuit components 942 include: semiconductor device components such as transistors, diodes, IC chips, and so forth; and passive device components such as chip capacitors, chip resistors, and so forth.

The multiple electro-optic device components are disposed in the display region 962 on the glass substrate 960 in the form of a matrix, which is not shown in the drawing. With the present embodiment, organic light emitting diodes are employed as the electro-optic device components.

Figure 23:
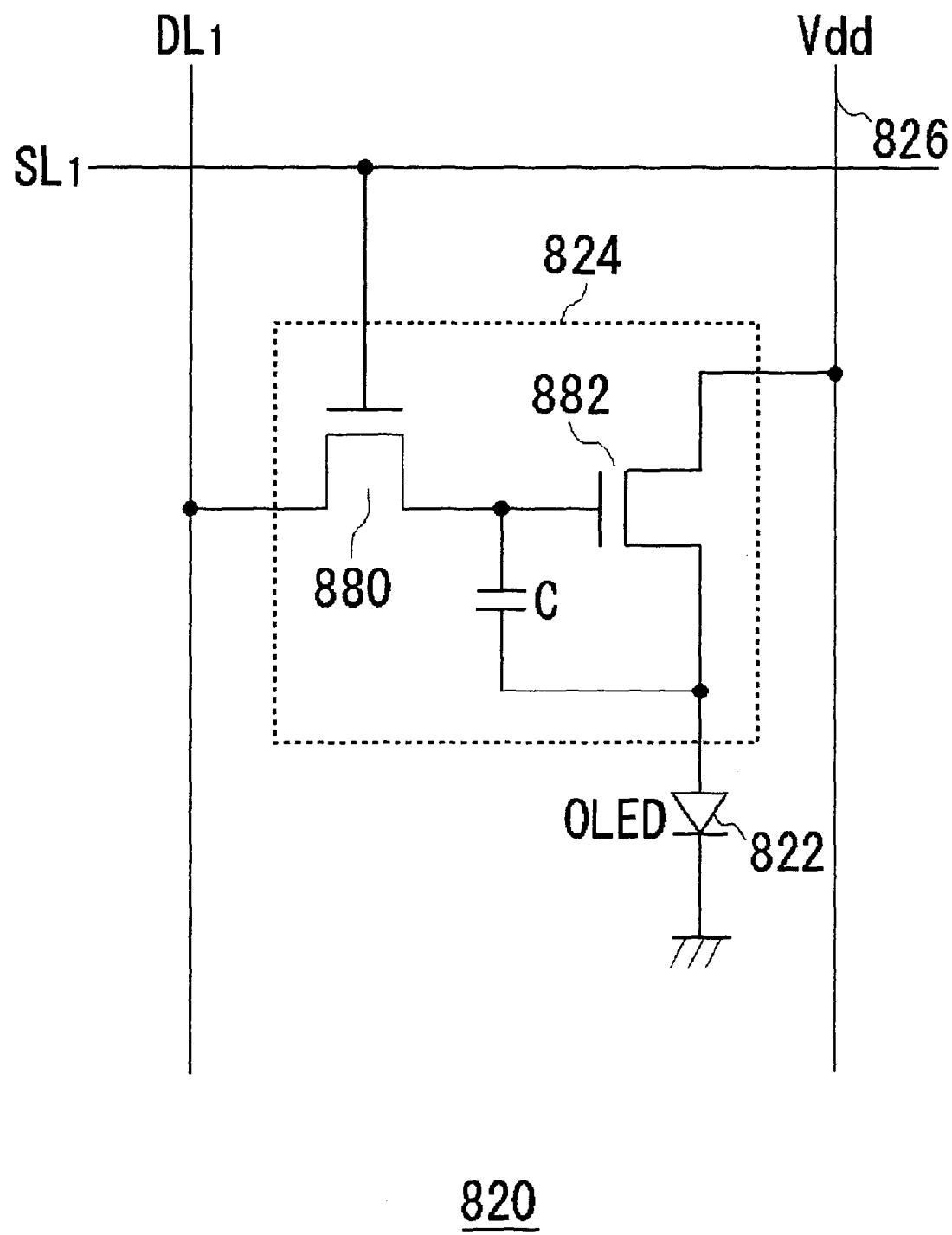
FIG. 23 is a circuit diagram which shows a configuration of each pixel including an electro-optic device component.

FIG. 23 is a circuit diagram which shows a configuration of each pixel including the electro-optic device component. A pixel 820 includes a pixel circuit 824 and a electro-optic device component 822. The electro-optic device component 822 includes a pair of electrodes, i.e., an anode and a cathode, provided so as to face one another, and a light emitting layer introduced therebetween. The light emitting layer has a layered structure in which a hole transport layer, a light emitting layer, and an electron transport layer, are layered on the anode in that order.

The pixel circuit 824 includes a switching transistor 880 which is a thin film transistor (which will simply be referred to as "transistor" hereafter), a driving transistor 882 for driving the electro-optic device component 822, and a capacitor C. While FIG. 23 shows an arrangement including a single switching transistor alone, an arrangement may be made including multiple switching transistors. Such an arrangement improves the retention property of the transistor, and suppresses the leak current thereof.

With regard to the switching transistor 880, the gate electrode is connected to a first scan line SL1. The drain electrode (or source electrode) is connected to a first signal line (DL1). The source electrode (or drain electrode) is connected to the gate electrode of the driving transistor 882 and one of the terminals of the capacitor C. The other terminal of the capacitor C is connected to the source electrode of the driving transistor 882.

With regard to the driving transistor 882, the source electrode is connected to the anode of the electro-optic device component 822. The drain electrode is connected to a power line 826 to which the voltage Vdd is to be applied to induce luminescence in the electro-optic device component 822 in the operation state. The anode of the electro-optic device component 822 is connected to the source electrode of the driving transistor 822. On the other hand, the cathode thereof is grounded.

Description will be made returning to FIGS. 22A and 22B. The driving circuit region 964 includes a signal line driving circuit for driving the signal lines of the multiple electro-optic device components, a scan line driving circuit for driving the scan lines thereof, and a control circuit for supplying signals for controlling the signal line driving circuit and the scan line driving circuit. The aforementioned electroconductive film 920 and the circuit components 924 form these circuits.

FIGS. 24A through 24E are process cross-sectional diagrams which show a manufacturing process for the driving circuit formed in the driving circuit region 964 shown in FIGS. 22A and 22B.

Figure 24A:
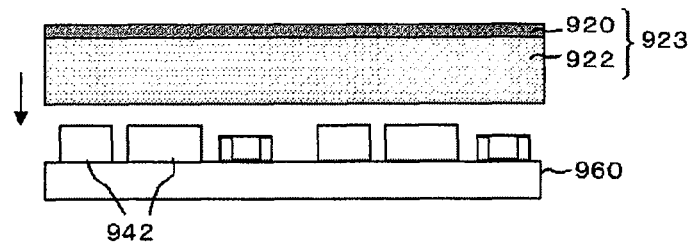
FIG. 24A through 24E are cross-sectional diagram which show a manufacturing process for a display device according to the first embodiment of the third group of the present invention.
Figure 24B:
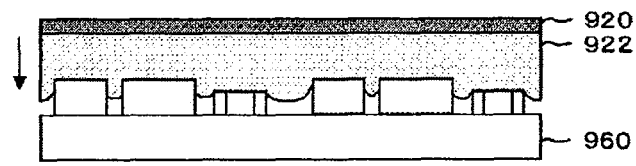

First, as shown in FIG. 24A, the multiple circuit components 942 are fixed on the glass substrate 960. Subsequently, as shown in FIG. 24B, an electroconductive-layer/insulating-resin-layer structure 923 formed of the electroconductive film 920 and the insulating resin film 922 is applied onto and is pressed into contact with the glass substrate 960 such that the circuit components 942 are embedded within the insulating resin film 922. In this step, the electroconductive-layer/insulating-resin-layer structure 923 may be applied onto the glass substrate 960, in the shape in which the region corresponding to the display region 962 is eliminated, as shown in FIG. 22A. Description has been made regarding an arrangement in which the driving circuit regions 964 are provided on the four sides of the glass substrate 960. Also, an arrangement may be made in which the driving circuit regions 964 are provided on two sides of the glass substrate 960, i.e., one horizontal side and one vertical side thereof.

Figure 24C:
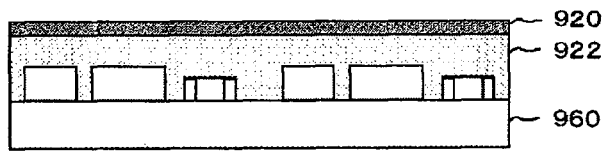

Subsequently, the insulating resin film 922 is heated in a vacuum or at a reduced pressure such that it is bonded to the glass substrate 960. As a result, as shown in FIG. 24C, the circuit components 942 are embedded within the insulating resin film 922, and are bonded to the insulating resin film 922. At the same time, the insulating resin film 922 is bonded to the glass substrate 960. This improves the adherence between the insulating resin film 922 and each of the circuit components 942.

The electroconductive film 920 may be formed of metal containing crystal particles having the major axis along the direction of the plane of the substrate (horizontal direction), e.g., rolled metal, for example. Examples of the rolled metal include copper foil, for example. Such an arrangement thus employing such rolled metal as the electroconductive film 920 prevents contamination of the driving circuit by impurities such as gas and so forth, which occurs in the process of forming interconnect members according to a sputter method, CVD method, plating method, or the like. This enables the manufacturing process without annealing processing for removing such impurities. Such a manufacturing process without heating for the annealing processing enables the driving circuit to be formed without damaging the performances of the circuit components 942. This improves the stability of the display device. Also, a pressed metal film formed with an electroplating method may be employed as the aforementioned metal containing crystal particles having the major axis along the direction of the plane of the substrate. The insulating resin film 922 may be formed of any material having a nature which permits the material to be softened by heating. Specifically, examples of such materials include: epoxy resin; melamine derivatives such as BT resin; liquid crystal polymer; PPE resin; polyimide resin; fluorocarbon resin; phenol resin; polyamide bismaleimide; and so forth. An arrangement employing such materials improves the rigidity of the display device, thereby improving the stability of the display device. In particular, an arrangement in which the insulating resin film 922 is formed of thermosetting resin such as epoxy resin, BT resin, PPE resin, polyimide resin, fluorocarbon resin, phenol resin, polyamide bismaleimide, and so forth, further improves the rigidity of the display device.

Examples of the epoxy resin include: bisphenol A type resin; bisphenol F type resin; bisphenol S type resin; phenol novolac resin; cresol novolac type epoxy resin; trisphenol-methane-type epoxy resins; alicyclic epoxy resin; and so forth. Examples of the melamine derivative include: melamine; melamine cyanurate; methylol-melamine; (iso) cyanuric acid; melam; melem; melon; succino-guanamine; melamine sulfate; aceto-guanamine sulfate; melam sulfate; guanyl-melamine sulfate; melamine resin; BT resin; cyanuric acid; iso-cyanuric acid; iso-cyanuric acid derivative; melamine iso-cyanurate; benzo-guanamine; melamine derivatives such as aceto-guanamine and so forth; guanidino compounds; and so forth.

Examples of the liquid crystal polymer include: aromatic liquid crystal polyester; polyimide; polyesterimide; and compositions containing such materials. Of these materials, liquid crystal polyester or a composition containing liquid crystal polyester is preferably employed since such a material exhibits well-balanced properties such as heat resistance, workability, and hygroscopicity.

Examples of the liquid crystal polyester includes: 1) a material obtained by a reaction between aromatic dicarboxylic acid, aromatic diol, and aromatic hydroxy carboxylic acid; (2) a material obtained by a reaction between different kinds of aromatic hydroxy carboxylic acid; (3) a material obtained by a reaction between aromatic dicarboxylic acid and aromatic diol; (4) a material obtained by a reaction between polyester such as polyethylene terephthalate and aromatic hydroxy carboxylic acid; and so forth. Note that, the ester derivative thereof may be employed, instead of the aforementioned aromatic dicarboxylic acid, aromatic diol, and aromatic hydroxy carboxylic acid. Also, materials in which the aromatic part of the aforementioned aromatic dicarboxylic acid, aromatic diol, and aromatic hydroxy carboxylic acid, are replaced by a halogen atom, alkyl group, or aryl group, may be employed.

Examples of the repeating structure units of the aforementioned crystal polyester include: a repeating structure unit derived from aromatic dicarboxylic acid (the following Expression (i)); a repeating structure unit derived from aromatic diol (the following Expression (ii)); and a repeating structure unit derived from aromatic hydroxy carboxylic acid (the following Expression (iii)).

$$-CO-A1-CO- \quad (i)$$

(here, A1 represents a ligand with a valence of 2 containing an aromatic ring)

$$-O-A2-O- \quad (ii)$$

(here, A2 represents a ligand with a valence of 2 containing an aromatic ring)

$$-CO-A3-O- \quad (iii)$$

(here, A3 represents a ligand with a valence of 2 containing an aromatic ring)

On the other hand, the insulating resin film 922 may contain a filling material such as filler, fiber, or the like. Examples of the filler include $SiO_2$, $SiN$, $AlN$, $Al_2O_3$, and so forth, in the form of particles or fibers. An arrangement employing the insulating resin film 922 containing such filler or fibers has the advantage of suppressing undesired bending of the insulating resin film 922 in the step of cooling the insulating resin film 922 to room temperature, after the step in which the insulating resin film 922 is heated such that the circuit components 942 are thermally bonded thereto. This improves adherence between the insulating resin film 922 and each of the circuit components 942 and the glass substrate 960. Furthermore, the insulating resin film 922 containing such fibers exhibits improved fluidity. This improves the adherence between the insulating resin film 922 and each of the circuit components 942 and the glass substrate 960. Accordingly, an aramid non-woven fabric is preferably employed as a material forming the insulating resin film 922 from this perspective. This improves the workability thereof.

Para-aramid fiber or meta-aramid fiber may be employed as the aramid fiber. Examples of the para-aramid fiber include poly(p-phenylene-terephthalamide) (PPD-T), for example. Examples of the meta-aramid fiber include poly(m-phenylene isophthalamide) (MPD-I), for example.

The content of the filler contained in the material forming the insulating resin film 922 may be determined as appropriate corresponding to the kind of material. For example, the insulating resin film 922 may contain such filler at a concentration of 50% by weight or less. Such an arrangement suitably maintains the adherence between the insulating resin film 922 and each of the circuit components 942 and the glass substrate 960.

The electroconductive-layer/insulating-resin-layer structure 923 may be formed by adhering the electroconductive film 920 onto the insulating resin film 922. Also, the electroconductive-layer/insulating-resin-layer structure 923 may be formed by coating a resin composition, which is a raw material of the insulating resin film 922, to the electroconductive film 920 and drying the resin composition thus coated. With the present embodiment, the resin composition may contain a hardening agent, hardening accelerator, and other components, without departing from the scope of the objects of the present embodiment. The electroconductive-layer/insulating-resin-layer structure 923 is applied onto the glass substrate 960 with the insulating resin film 922 being in the B-stage state. Such an arrangement improves the adherence between the insulating resin film 922 and each of the circuit components 942 and the glass substrate 960. Subsequently, the insulating resin film 922 is heated corresponding to the kind of resin forming the insulating resin film 922. In this step, the electroconductive-layer/insulating-resin-layer structure 923 is bonded to the circuit components 942 and the glass substrate 960 in a vacuum or at reduced pressure. Also, another manufacturing method may be employed as follows. That is to say, first, the insulating resin film 922 in the B-stage state is applied onto the glass substrate 960. Then, the electroconductive film 920 is further applied onto the insulating resin film 922. Subsequently, the insulating resin film 922 is thermally bonded to the circuit components 942 while thermally bonding the electroconductive film 920 to the insulating resin film 922. Thus, the electroconductive-layer/insulating-resin-layer structure 923 is formed.

Subsequently, through holes are formed in the insulating resin film 922. Then, each through hole is filled with an electroconductive material, thereby forming via plugs 921. The through holes may be formed using a carbon dioxide gas laser or the like. The via plugs 921 may be formed by electroless plating or electroplating. Before this step, a cover such as a PET film or the like is provided on the display region 962, for example. This prevents the electroconductive material from adhering to the display region 962.

Figure 24D:
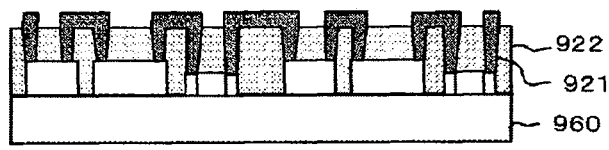
Figure 24E:
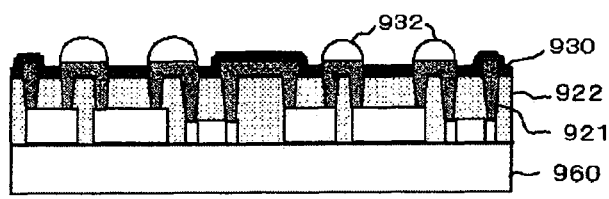

Subsequently, patterning of the electroconductive film 920 is performed so as to electrically connect the multiple circuit components 942. The patterning may be performed by etching using a etching resist as a mask. Specifically, chemical etchant is sprayed on the resist-patterned electroconductive film 920 so that the exposed portion is removed as an unnecessary region of the electroconductive film 920, thereby forming a interconnection. Conventional etching resist materials employed for manufacturing of printed wiring boards may be employed as the etching resist. Specifically, silk screen printing may be performed using resist ink. Also, a photosensitive dry film for etching resist may be employed. In this case, first, the photosensitive dry film for etching resist is laminated on the electroconductive film 920, and a photomask is overlaid thereupon with a predetermined pattern which enables light to pass therethrough so as to form a light pattern corresponding to a interconnection. Then, exposure processing is performed using ultraviolet light. Subsequently, developing is performed using a developing solution so that unexposed portions are removed, thereby forming the interconnection. Let us consider a case in which the electroconductive film 920 is formed of a copper foil. In this case, conventional chemical etchants employed for manufacturing printed wiring boards may be employed. Examples of such chemical etchants include: a solution of cupric chloride and hydrochloric acid; a ferric chloride solution; a solution of sulfuric acid and hydrogen peroxide; an ammonium persulfate solution; and so forth. Thus, a driving circuit having a interconnection is formed, as shown in FIG. 24D. As described above, such an arrangement enables a fine interconnection to be formed by patterning the electroconductive film 920, thereby enabling an intricate driving circuit to be formed. Subsequently, an dielectric film 930 serving as a protective film and solder balls 932 are formed as shown in FIG. 24E.

With the present embodiment, the insulating resin film 922 is fixed to the circuit components 942 and the glass substrate 960. Accordingly, the circuit components 942 are fixed to the driving circuit region 964 in a sure manner without using a frame or the like. This simplifies the configuration of the display device. Furthermore, such an arrangement employing no frame or the like enables the size of the display device to be reduced.

As described later, with regard to the display device thus formed, another electroconductive-layer/insulating-resin-layer structure 923 may be layered on the electroconductive film 920 of the electroconductive-layer/insulating-resin-layer structure 923 so as to form a interconnection layer. With such an arrangement, multiple circuit components 942 are electrically connected, thereby forming a driving circuit.

Figure 25A:
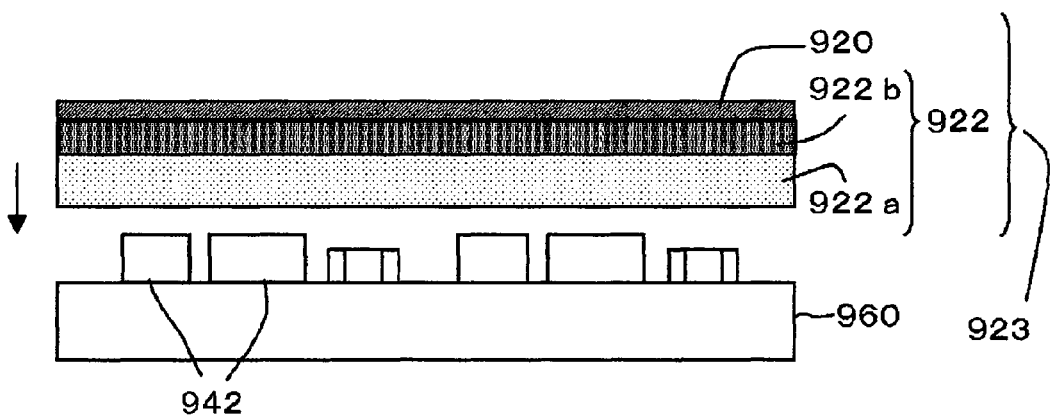
FIG. 25A through 25C are diagram which show another example of a structure of a display device according to the first embodiment of the third group of the present invention.
Figure 25B:
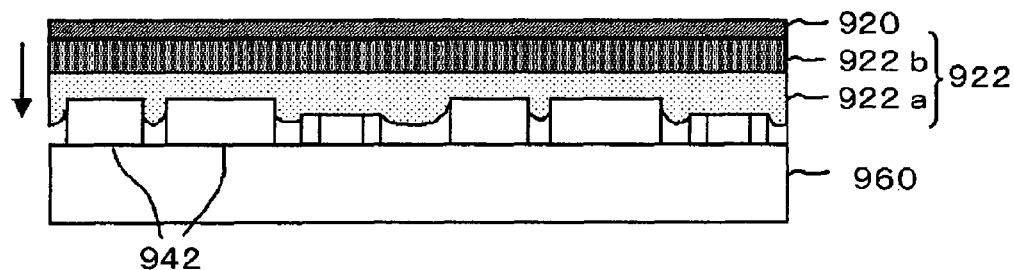
Figure 25C:
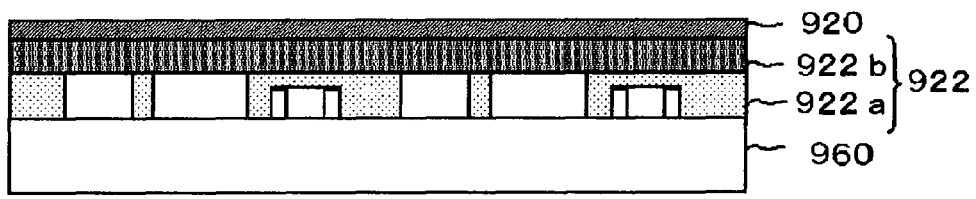

Also, the electroconductive-layer/insulating-resin-layer structure 923 may have a structure as shown in FIGS. 25A through 25C. As shown in FIGS. 25A through 25C, the insulating resin film 922 of the electroconductive-layer/insulating-resin-layer structure 923 may be formed of a first insulating resin film 922*a* and a second insulating resin film 922*b*. Here, the second insulating resin film 922*b* is formed on the first insulating resin film 922*a*, and the electroconductive film 920 is then formed on the second insulating resin film 922*b*.

The second insulating resin film 922*b* is formed of a material which exhibits a greater rigidity than that forming the first insulating resin film 922*a* in a step in which the circuit components 942 are thermally bonded to and embedded within the insulating resin film 922. This enables the circuit components 942 to be embedded within the first insulating resin film

922a such that the profile of the insulating resin film 922 is maintained, due to the rigidity thereof, during a thermal bonding step.

Description will be made below with reference to FIGS. 25A through 25C.

First, as shown in FIGS. 25A and 25B, the electroconductive-layer/insulating-resin-layer structure 923 is applied to the glass substrate 960 in the state in which the multiple circuit components 942 are fixed on the glass substrate 960 such that the circuit components 942 are embedded within the insulating resin film 922. Subsequently, the insulating resin film 922 is heated in a vacuum or at a reduced pressure such that it adheres to the glass substrate 960. Thus, the display device having a configuration described in FIG. 25C is obtained.

The first insulating resin film 922a and the second insulating resin film 922b may be formed of one of the materials described above as appropriate. Examples of such materials include: epoxy resin; melamine derivatives such as BT resin; liquid crystal polymer; PPE resin; polyimide resin; fluorocarbon resin; phenol resin; polyamide bismaleimide; and so forth.

Here, the first insulating resin film 922a may be formed of a material having a nature that permits it to be easily softened as compared with the material forming the second insulating resin film 922b. With such an arrangement, in a thermal bonding step, the first insulating resin film 922a becomes more flexible than the second insulating resin film 922b. Accordingly, in this step, the circuit components 942 are embedded within the first insulating resin film 922a smoothly, while the rigidity of the second insulating resin film 922b suppresses the deformation of the overall profile of the insulating resin film 922. On the other hand, let us consider a case in which the multiple circuit components 942 are provided with different heights. In such a case, the second insulating resin film 922b serves as a stopper layer for preventing the circuit components 942 from penetrating too far toward the insulating resin film 922. This maintains the constant film thickness of the insulating resin film 922. Thus, such an arrangement improves the dimensional accuracy in manufacturing the display device. Furthermore, such an arrangement improves the rigidity of the display device.

Also, the first insulating resin film 922a may be formed of a material having a lower glass-transition temperature than that of the material forming the second insulating resin film 922b. Also, as another example, the first insulating resin film 922a may be formed of a material having a greater adherence with the circuit components 942 than that of the material forming the second insulating resin film 922b. Such arrangements exhibit the same advantages as described above.

On the other hand, the first insulating resin film 922a and the second insulating resin film 922b may contain a filling material such as filler, fiber, or the like. With such an arrangement, the first insulating resin film 922a is formed with a smaller concentration of the filler than that of the second insulating resin film 922b. Also, an arrangement may be made in which only the second insulating resin film 922b contains the filler, and the first insulating resin film 922a contains no filler. Such arrangements improve the flexibility of the first insulating resin film 922a, thereby facilitating a step in which the circuit components 942 are embedded within the first insulating resin film 922a. At the same time, such arrangements suppresses undesired bending of the insulating resin film 922 by actions of the second insulating resin film 922b.

With the present embodiment, the first insulating resin film 922a and the second insulating resin film 922b are formed of suitable materials corresponding to their respective purposes, as described above. Such an arrangement allows the circuit components 942 to be properly embedded within the insulating resin film 922. Furthermore, such an arrangement improves the rigidity and moldability of the display device.

Figure 26:
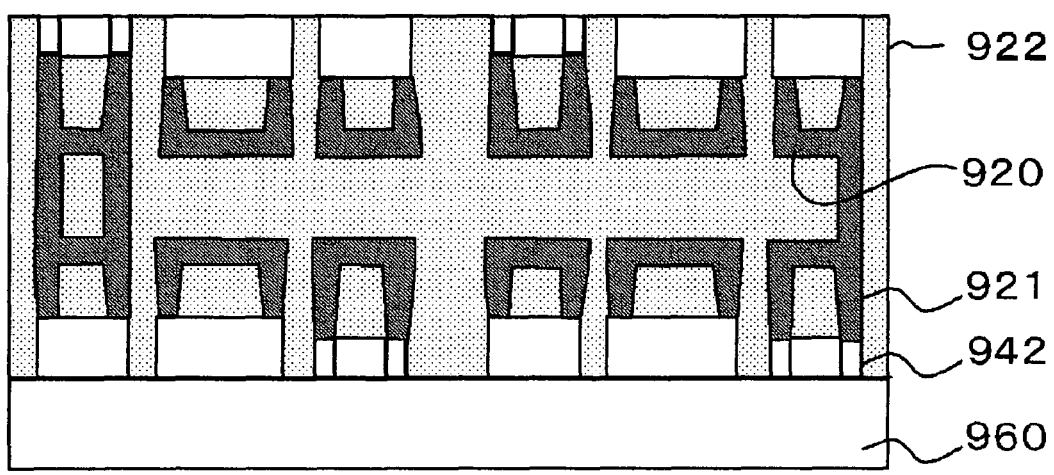
FIG. 26 is a cross-sectional diagram which shows a structure of a display device according to the first embodiment of the third group of the present invention.

FIG. 26 is a cross-sectional diagram which shows a structure of a display device in which the sealed structures are layered, each of which has a structure in which the circuit components 942 are embedded and sealed within the insulating resin film 922 of the electroconductive-layer/insulating-resin-layer structure 923 according to the process described above.

FIG. 26 shows a display device manufactured as follows. That is to say, first, the electroconductive-layer/insulating-resin-layer structure (not shown in FIG. 26) is thermally bonded onto the sealed structure, and another sealed structure is then layered thereon. With such an arrangement, the electroconductive film 920 has a interconnection pattern. The electroconductive film 920 of the upper-layer sealed structure and the other electroconductive film 920 of the lower-layer electroconductive-layer/insulating-resin-layer structure can be electrically connected by ambient-temperature connection or by soldering. Furthermore, through holes are formed in the insulating resin film 922 using a carbon dioxide gas laser or the like. Then, each through hole is filled with an electroconductive material, thereby forming via plugs 921. Such an arrangement effects an electric connection between the layers. Note that examples of the methods for forming the through holes include: machining; chemical etching using chemicals; and dry etching using plasma; and so forth, in addition to the carbon dioxide gas laser. Such an arrangement enables a configuration to be formed, in which a control circuit for driving a signal line driving circuit and a scan line driving circuit is provided on these driving circuits provided on the periphery of the display region 962, for example. Such an arrangement enables the size of the display device to be further reduced.

(Second Embodiment)

Figure 27:
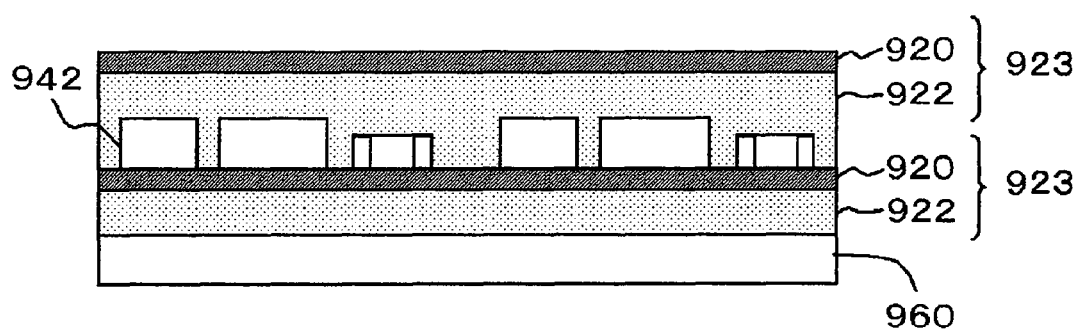
FIG. 27 is a cross-sectional diagram which shows a structure of a display device according to a second embodiment of the third group of the present invention.

FIG. 27 is a cross-sectional diagram which shows a configuration of a display device according to the third group of the present embodiment.

The difference between the present embodiment and the first embodiment is as follows. That is to say, with the present embodiment, the electroconductive-layer/insulating-resin-layer structure 923 is bonded onto the glass substrate 960, and multiple circuit components 942 are then disposed thereon. Note that the same components as those in the first embodiment are denoted by the same reference numerals, and description thereof will be omitted as appropriate.

With the present embodiment, the insulating resin film 922 is provided on the glass substrate 960 so as to be in contact with the glass substrate 960. With such a structure, the metal forming the electroconductive film 920 is not in direct contact with the glass substrate 960. Accordingly, such an arrangement prevents diffusion of copper into the glass substrate 960 even if the electroconductive film 920 is formed of copper. This allows the interconnect member to be formed using low resistance copper, thereby improving the electric properties of the display device. Furthermore, the present embodiment simplifies the configuration of the display device in the same way as with the first embodiment. Furthermore, the present embodiment provides a small-size and lightweight display device.

Description has been made regarding the present invention with reference to the aforementioned embodiments. The above-described embodiments have been described for exemplary purposes only, and are by no means intended to be interpreted restrictively. Rather, it can be readily conceived by those skilled in this art that various modifications may be made by making various combinations of the aforementioned components or the aforementioned processing, which are also encompassed in the technical scope of the present invention.

Description has been made regarding an arrangement in which the electro-optic device components and the driving circuit are provided on the single glass substrate 960. Also, the electro-optic device components and the driving circuit may be provided on separate substrates.

Description has been made regarding an arrangement in which a interconnection is formed after formation of the electroconductive-layer/insulating-resin-layer structure 923 on the glass substrate 960 on which electro-optic device components have been formed. Also, an arrangement may be made in which a interconnection is formed before adhesion of the electroconductive-layer/insulating-resin-layer structure 923 onto the glass substrate 960. As described above, with the present embodiment, the electroconductive-layer/insulating-resin-layer structure 923 has such a structure formed of the insulating resin film 922 and the electroconductive film 920. This also allows such a manufacturing procedure to be employed. Such an arrangement allows a process in which the electric properties of the electroconductive-layer/insulating-resin-layer structure 923, in which the interconnection has been formed, can be evaluated before it is adhered to the glass substrate 960. This enables detection of defects, which may be contained in the interconnection, before adhesion thereof to the glass substrate 960, thereby improving the manufacturing yield rate of the display device.

What is claimed is:

1. A method for manufacturing a semiconductor module, the method comprising steps of:
   preparing a layered structure of an insulating resin film and an electroconductive film formed on the entirety of the insulating resin film; and
   after preparing the layered structure, bonding the layered structure to a substrate having circuit components fixed on the surface thereof so as to embed the circuit components within said insulating resin film and fix said circuit components within said insulating resin film so as to form the semiconductor module, wherein:
   said plurality of circuit components are provided on said substrate,
   said substrate is flexible, and
   said plurality of circuit components are embedded within said insulating resin film in the state in which said substrate is extended so as to increase the space between said adjacent circuit components, in said embedding said circuit components within said insulating resin film.

2. The manufacturing method according to claim 1, further comprising:
   removing said substrate from said circuit components after said fixing said circuit components within said insulating resin film, so as to expose said circuit components.

3. A method for manufacturing a semiconductor module, the method comprising steps of:
   applying a layered structure of an insulating resin film and an electroconductive film to fixed circuit components;
   embedding said circuit components within said insulating resin film; and
   fixing said circuit components within said insulating resin film by bonding,
   wherein said circuit components provided on a substrate are embedded within said insulating resin film in said embedding said circuit components within said insulating resin film,
   wherein said plurality of circuit components are provided on said substrate,
   wherein said substrate is flexible, and
   wherein said plurality of circuit components are embedded within said insulating resin film in the state in which said substrate is extended so as to increase the space between said adjacent circuit components, in said embedding said circuit components within said insulating resin film.

4. The manufacturing method according to claim 3, further comprising:
   removing said substrate from said circuit components after said fixing said circuit components within said insulating resin film, so as to expose said circuit components.

* * * * *